(12) United States Patent
Lim et al.

(10) Patent No.: US 12,433,145 B2
(45) Date of Patent: Sep. 30, 2025

(54) DISPLAY DEVICE HAVING PROTECTION TAPE AND METHOD FOR FABRICATING ELECTRONIC DEVICE USING THE SAME

(71) Applicant: Samsung Display Co., Ltd., Yongin-si (KR)

(72) Inventors: Heesung Lim, Seoul (KR); Sungyong Kwon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 474 days.

(21) Appl. No.: 17/713,238

(22) Filed: Apr. 5, 2022

(65) Prior Publication Data

US 2022/0393136 A1 Dec. 8, 2022

(30) Foreign Application Priority Data

Jun. 4, 2021 (KR) .......................... 10-2021-0072965
Aug. 18, 2021 (KR) .......................... 10-2021-0108782

(51) Int. Cl.
| | |
|---|---|
| *H10K 71/80* | (2023.01) |
| *H10K 50/844* | (2023.01) |
| *H10K 59/12* | (2023.01) |
| *H10K 59/131* | (2023.01) |
| *H10K 59/40* | (2023.01) |
| *H10K 59/80* | (2023.01) |

(Continued)

(52) U.S. Cl.
CPC ........... *H10K 71/80* (2023.02); *H10K 50/844* (2023.02); *H10K 59/131* (2023.02); *H10K 59/40* (2023.02); *H10K 59/871* (2023.02); *H10K 71/00* (2023.02); *H10K 77/111* (2023.02); *H10K 59/1201* (2023.02); *H10K 2102/311* (2023.02)

(58) Field of Classification Search
CPC .... H10K 50/844; H10K 59/131; H10K 59/40; H10K 71/00; H10K 71/80; H10K 77/111; H10K 59/1201; H10K 2102/311; H10K 59/871

See application file for complete search history.

(56) References Cited

U.S. PATENT DOCUMENTS

| | | |
|---|---|---|
| 8,081,434 B2 | 12/2011 | Jung |
| 10,490,770 B2 | 11/2019 | Kim et al. |

(Continued)

FOREIGN PATENT DOCUMENTS

| | | |
|---|---|---|
| KR | 1020080080715 A | 9/2008 |
| KR | 10-2018-0029190 | 3/2018 |

(Continued)

*Primary Examiner* — Caleb E Henry
(74) *Attorney, Agent, or Firm* — CANTOR COLBURN LLP

(57) ABSTRACT

A display device includes a window, a display module disposed under the window, and a protection tape that is disposed on a rear surface of the display module and that protects the display module. The protection tape includes an insulating base layer including a first area and a second area, an adhesive layer disposed between the insulating base layer and the rear surface of the display module in the second area, and a step layer disposed on the insulating base layer in the first area. An end of the protection tape is located further outward than an end of the window with respect to a center area of the display module, and the step layer and the insulating base layer are not integrally formed with each other.

37 Claims, 35 Drawing Sheets

(51) Int. Cl.
  *H10K 71/00*  (2023.01)
  *H10K 77/10*  (2023.01)
  *H10K 102/00* (2023.01)

(56) References Cited

U.S. PATENT DOCUMENTS

| | | | |
|---|---|---|---|
| 10,905,000 B2 | 1/2021 | Lee et al. | |
| 2016/0126496 A1* | 5/2016 | Wang | H10K 50/82 |
| | | | 257/40 |
| 2018/0342707 A1* | 11/2018 | Lee | H10K 77/111 |
| 2019/0380197 A1* | 12/2019 | Lee | H05K 1/028 |
| 2020/0057472 A1* | 2/2020 | Kang | G06F 1/1601 |
| 2020/0133344 A1 | 4/2020 | Park et al. | |
| 2020/0135063 A1* | 4/2020 | Jang | G06F 1/1652 |
| 2021/0126209 A1* | 4/2021 | Lee | H10K 50/841 |
| 2021/0175462 A1* | 6/2021 | Shin | G06F 1/1601 |

FOREIGN PATENT DOCUMENTS

| | | |
|---|---|---|
| KR | 10-2019-0139352 | 12/2019 |
| KR | 1020200021578 A | 3/2020 |

* cited by examiner

DISPLAY DEVICE HAVING PROTECTION TAPE AND METHOD FOR FABRICATING ELECTRONIC DEVICE USING THE SAME

CROSS-REFERENCE TO RELATED APPLICATIONS

This application claims priority from and the benefit of Korean Patent Application Nos. 10-2021-0072965 and 10-2021-0108782 filed on Jun. 4, 2021 and Aug. 18, 2021, respectively, which are hereby incorporated by reference for all purposes as if fully set forth herein.

BACKGROUND

Field

Embodiments described herein relate to a display device and a method for fabricating an electronic device using the same, and more particularly, relate to a display device for reducing defects in a product assembly process and a method for fabricating an electronic device using the display device.

Discussion of the Background

Electronic devices, such as smart phones, tablet computers, notebook computers, smart televisions, and the like, have been developed. The electronic devices include a display device to provide information. The electronic devices further include various electronic modules, in addition to the display device.

An electronic device is fabricated by assembling a display device and electronic modules. At this time, the electronic modules are located in cooperation with one another using an external case and a bracket of the electronic device.

The above information disclosed in this Background section is only for understanding of the background of the inventive concepts, and, therefore, it may contain information that does not constitute prior art.

SUMMARY

Devices constructed according to one or more inventive concepts are capable of protecting a display device during manufacturing of an electronic device.

Embodiments provide a display device capable of protecting a display module in a product assembly process, and a method for fabricating an electronic device using the display device.

Additional features of the inventive concepts will be set forth in the description that follows, and in part will be apparent from the description, or may be learned by practice of the inventive concepts.

According to an embodiment, a display device includes a window, a display module disposed under the window, and a protection tape that is disposed on a rear surface of the display module and that protects the display module.

The protection tape includes an insulating base layer including a first area and a second area, an adhesive layer disposed between the insulating base layer and the rear surface of the display module in the second area, and a step layer disposed on the insulating base layer in the first area.

An end of the protection tape is located outward of an end of the window, and the step layer and the insulating base layer are not integrally formed with each other.

According to an embodiment, a display device includes a window, a display module disposed under the window, and a protection tape that is disposed on a rear surface of the display module and that protects the display module.

The protection tape includes an insulating base layer including a first area and a second area, an adhesive layer disposed on the insulating base layer in the first and second areas, a cover layer disposed on the adhesive layer in the first area, a step layer disposed on the cover layer, and a sub-adhesive layer disposed between the step layer and the cover layer.

An end of the protection tape is located outward of an end of the window.

According to an embodiment, a method for fabricating an electronic device includes preparing a display device including a window, a display module disposed under the window, and a protection tape that is disposed on a rear surface of the display module and that protects the display module, removing the protection tape from the display device, and coupling the display module with a component of the electronic device.

An end of the protection tape is located outward of an end of the window, and the protection tape includes an insulating base layer including a first area and a second area, an adhesive layer disposed between the insulating base layer and the rear surface of the display module in the second area, a step layer disposed on the insulating base layer in the first area, and a sub-adhesive layer disposed between the step layer and the insulating base layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
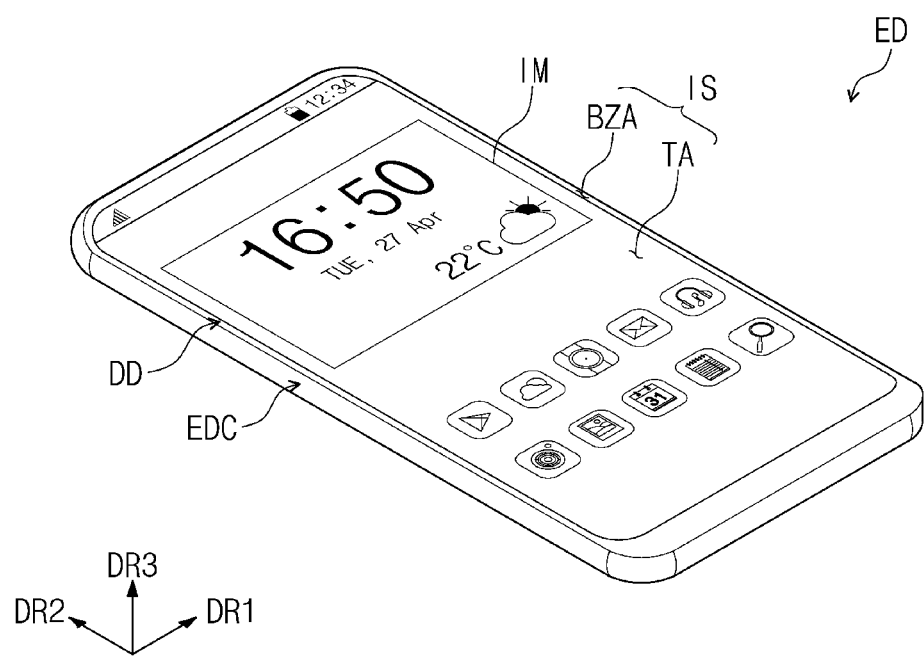
FIG. 1A is a perspective view of an electronic device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display panel according to an embodiment will be described with reference to the accompanying drawings.

Figure 1B:
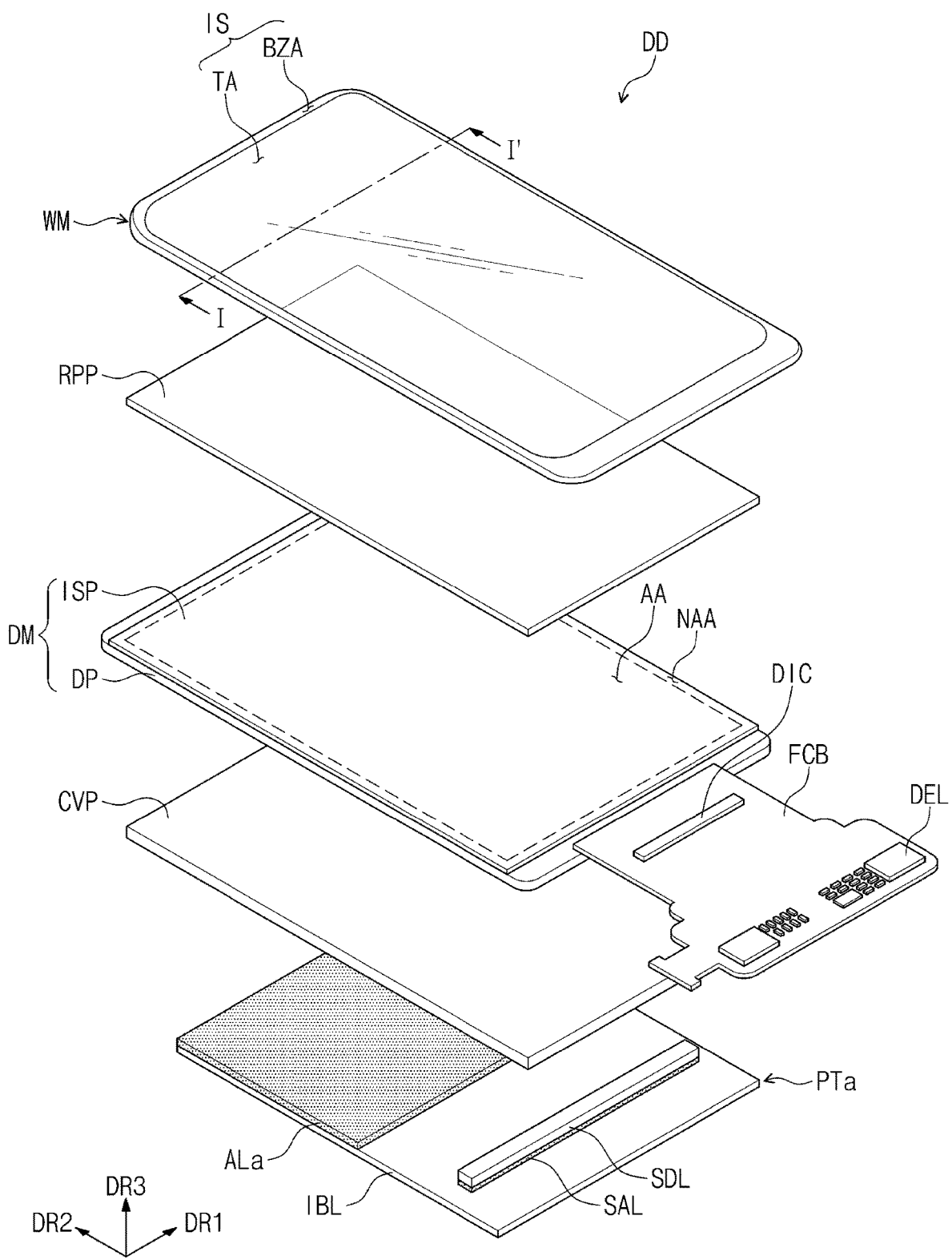
FIG. 1B is an exploded perspective view of a display device according to an embodiment.
Figure 1C:
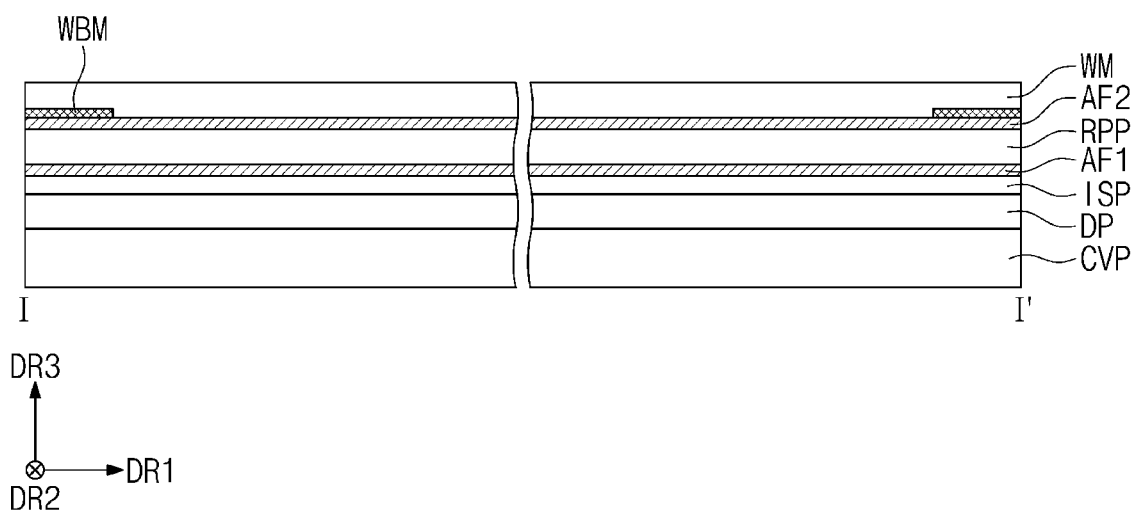
FIG. 1C is a sectional view taken along line I-I' in FIG. 1B.

FIG. 1A is a perspective view of an electronic device according to an embodiment. FIG. 1B is an exploded perspective view of a display device according to an embodiment. FIG. 1C is a sectional view taken along line I-I' in FIG. 1B.

Referring to FIGS. 1A to 1C, the electronic device ED may be activated depending on an electrical signal. The electronic device ED may include various embodiments. For example, the electronic device ED may be an electronic device such as a smart watch, a tablet computer, a notebook computer, a computer, a smart television, or the like.

The electronic device ED may display an image IM in a third direction DR3 on a display surface IS parallel to a first direction DR1 and a second direction DR2. The display surface IS, on which the image IM is displayed, may correspond to the front surface of the electronic device ED. The image IM may include a still image as well as a dynamic image.

In this embodiment, the front surfaces (or, the upper surfaces) and the rear surfaces (or, the lower surfaces) of members are defined with respect to the third direction DR3 in which the image IM is displayed. The front surface and the rear surface of each of the members may be opposite each other in the third direction DR3, and the normal directions of the front surface and the rear surface may be parallel to the third direction DR3.

The separation distance between the front surface and the rear surface of the electronic device ED in the third direction DR3 may correspond to the thickness of the electronic device ED in the third direction DR3. The directions indicated by the first, second, and third directions DR1, DR2, and DR3 may be relative concepts and may be changed to different directions.

The electronic device ED may sense an external input applied from the outside. The external input may include various forms of inputs provided from outside the electronic device ED. For example, the external input may include not only a touch of a part of a user's body (e.g., the user's hand) on the electronic device ED but also an external input (e.g., a hovering input) applied by an input tool or a part of the user's body that is proximate to, or spaced a predetermined distance apart from, the electronic device ED. Furthermore, the external input may have various forms such as force, pressure, temperature, light, and the like.

The front surface of the electronic device ED may be divided into a light transmitting area TA and a bezel area BZA. The light transmitting area TA may be an area on which the image IM is displayed. The user views the image IM through the light transmitting area TA. In this embodiment, the light transmitting area TA is illustrated in a quadrilateral shape having rounded corners. However, this is illustrative, and the light transmitting area TA may have various shapes and is not limited to any one embodiment.

The bezel area BZA is adjacent to the light transmitting area TA. The bezel area BZA may have a predetermined color. The bezel area BZA may surround the light transmitting area TA. Accordingly, the shape of the light transmitting area TA may be substantially defined by the bezel area BZA. However, this is illustrative, and the bezel area BZA may be disposed adjacent to only one side of the light transmitting area TA, or may be omitted in some implementations of this embodiment. The electronic device ED according to the embodiment of the present disclosure may include various embodiments and is not limited to any one embodiment.

The electronic device ED may include the display device DD and an external case EDC. The display device DD may include a window WM, a display module DM, an anti-reflection film RPP, a cover panel CVP, and a protection tape PTa. The display module DM may include a display panel DP and an input sensing layer ISP.

The window WM may be formed of a transparent material through which an image is able to be output. For example, the window WM may be formed of glass, sapphire, plastic, or the like. Although the window WM is illustrated as a single layer, the window WM is not limited thereto and may include a plurality of layers. The above-described bezel area BZA of the display device DD may be formed by printing a material having a predetermined color on substantially one area of the window WM. In an embodiment of the present disclosure, the window WM may include a light blocking pattern WBM for defining the bezel area BZA. The light blocking pattern WBM may be a colored organic film and may be formed by, for example, a coating method.

The display panel DP according to an embodiment may be an emissive display panel, but is not particularly limited thereto. For example, the display panel DP may be an organic light emitting display panel, an inorganic light emitting display panel, or a quantum dot light emitting display panel. An emissive layer of the organic light emitting display panel may contain an organic light emitting material, and an emissive layer of the inorganic light emitting display panel may contain an inorganic light emitting material. An emissive layer of the quantum dot light emitting display panel may contain quantum dots, quantum rods, and the like. Hereinafter, the display panel DP will be described as an organic light emitting display panel.

The input sensing layer ISP may be directly disposed on the display panel DP. According to an embodiment, the input sensing layer ISP may be formed on the display panel DP by a continuous process. That is, when the input sensing layer ISP is directly disposed on the display panel DP, an adhesive film is not disposed between the input sensing layer ISP and the display panel DP.

The display panel DP generates the image IM, and the input sensing layer ISP obtains coordinate information of an external input (e.g., a touch event).

The anti-reflection film RPP decreases the reflectivity of external light incident from above the window WM. The anti-reflection film RPP according to an embodiment may include a phase retarder and a polarizer. The phase retarder may be of a film type or a liquid-crystal coating type and may include a λ/2 phase retarder and/or a λ/4 phase retarder. The polarizer may also be of a film type or a liquid-crystal coating type. The film type polarizer may include a stretchable synthetic resin film, and the liquid-crystal coating type polarizer may include liquid crystals arranged in a predetermined arrangement. The phase retarder and the polarizer may be implemented with one polarizer film. The anti-reflection film RPP may further include a protective film disposed on the top or bottom of the polarizer film.

The anti-reflection film RPP may be disposed over the input sensing layer ISP. That is, the anti-reflection film RPP may be disposed between the input sensing layer ISP and the window WM. The input sensing layer ISP, the anti-reflection film RPP, and the window WM may be coupled together through adhesive films. A first adhesive film AF1 is disposed between the input sensing layer ISP and the anti-reflection film RPP, and a second adhesive film AF2 is disposed between the anti-reflection film RPP and the window WM. Accordingly, the anti-reflection film RPP is coupled to the input sensing layer ISP by the first adhesive film AF1, and the window WM is coupled to the anti-reflection film RPP by the second adhesive film AF2.

In an embodiment, the first and second adhesive films AF1 and AF2 may each include an optically clear adhesive (OCA) film. However, without being limited thereto, the first and second adhesive films AF1 and AF2 may include a general adhesive or sticky substance. For example, the first and second adhesive films AF1 and AF2 may each contain a pressure sensitive adhesive (PSA), an optically clear adhesive (OCA), or an optically clear resin (OCR). In addition to the anti-reflection film RPP, a functional layer for performing a different function, for example, a protection layer may be additionally disposed between the display module DM and the window WM.

The display module DM may display an image depending on an electrical signal and may transmit/receive information about an external input. The display module DM may be defined by an active area AA and a peripheral area NAA. The active area AA may be defined as an area that outputs an image provided by the display module DM.

The peripheral area NAA is adjacent to the active area AA. For example, the peripheral area NAA may surround the active area AA. However, this is illustrative, and the peripheral area NAA may be defined in various shapes and is not limited to any one embodiment. According to an embodiment, the active area AA of the display module DM may correspond to at least part of the light transmitting area TA.

The display module DM may further include a flexible circuit film FCB and a driving chip IC DIC. The flexible circuit film FCB may be electrically connected with the display panel DP. The flexible circuit film FCB may be coupled to the peripheral area NAA of the display panel DP through a bonding process. The driving chip DIC may be mounted on the flexible circuit film FCB and may be electrically connected with the display panel DP. The driving chip DIC may include drive circuits for driving pixels of the display panel DP, for example, a data drive circuit. FIG. 1B illustrates the structure in which the driving chip DIC is mounted on the flexible circuit film FCB. However, the present disclosure is not limited thereto. For example, the driving chip DIC may be mounted on the peripheral area NAA of the display panel DP.

The display module DM may further include a plurality of driving elements DEL mounted on the flexible circuit film FCB. The plurality of driving elements DEL may include a circuit unit for converting a signal input from the outside into a signal required for the driving chip DIC or a signal required for driving the display panel DP. The flexible circuit film FCB may be bent and disposed under the display panel DP.

The cover panel CVP is disposed on the rear surface of the display panel DP. The cover panel CVP, which is disposed on the rear surface of the display panel DP, may improve the impact resistance of the display device DD. The cover panel CVP may be fixed to the rear surface of the display panel DP through an adhesive film. The adhesive film may be a pressure sensitive adhesive (PSA), an optical clear adhesive (OCA), or an optical clear resin (OCR). The flexible circuit film FCB may be disposed on the rear surface of the cover panel CVP.

The protection tape PTa is disposed under the display panel DP. Specifically, the protection tape PTa may be disposed on the rear surface of the cover panel CVP and may cover the flexible circuit film FCB. The protection tape PTa may have a quadrilateral tape shape. However, the shape of the protection tape PTa is not limited thereto. The protection tape PTa may be implemented in various shapes having a size sufficient to cover the flexible circuit film FCB.

The protection tape PTa includes an insulating base layer IBL, an adhesive layer ALa, and a step layer SDL. The insulating base layer IBL may contain an insulating material. The insulating material may be a synthetic resin film and may contain at least one of polyethylene terephthalate (PET), polyimide (PI), polyamide (PAI), polyethylene naphthalate (PEN), or polycarbonate (PC). The insulating base layer IBL may include a first area A1 and a second area A2. The adhesive layer ALa is disposed on the insulating base layer IBL in the second area A2. Particularly, the adhesive layer ALa is disposed between the insulating base layer IBL and the rear surface of the display module DM.

The step layer SDL is disposed on the insulating base layer IBL in the first area A1. The step layer SDL and the insulating base layer IBL are not integrally formed with each other. The protection tape PTa may further include a sub-adhesive layer SAL disposed between the step layer SDL and the insulating base layer IBL. The step layer SDL may be fixed to the insulating base layer IBL by the sub-adhesive layer SAL. The protection tape PTa will be described below in detail with reference to FIGS. 4A to 21.

The external case EDC accommodates the display device DD. The external case EDC may be coupled with the window WM and may define the exterior of the display device DD. The external case EDC protects components accommodated therein, by absorbing shocks applied from the outside and preventing infiltration of foreign matter/moisture into the display device DD. In an embodiment, the external case EDC may be implemented in a form in which a plurality of receiving members are coupled.

The protection tape PTa may be removed from the display device DD before the display device DD is accommodated in the external case EDC. Accordingly, the window WM, the anti-reflection film RPP, the display module DM, and the cover panel CVP may be accommodated in the external case EDC.

Figure 2:
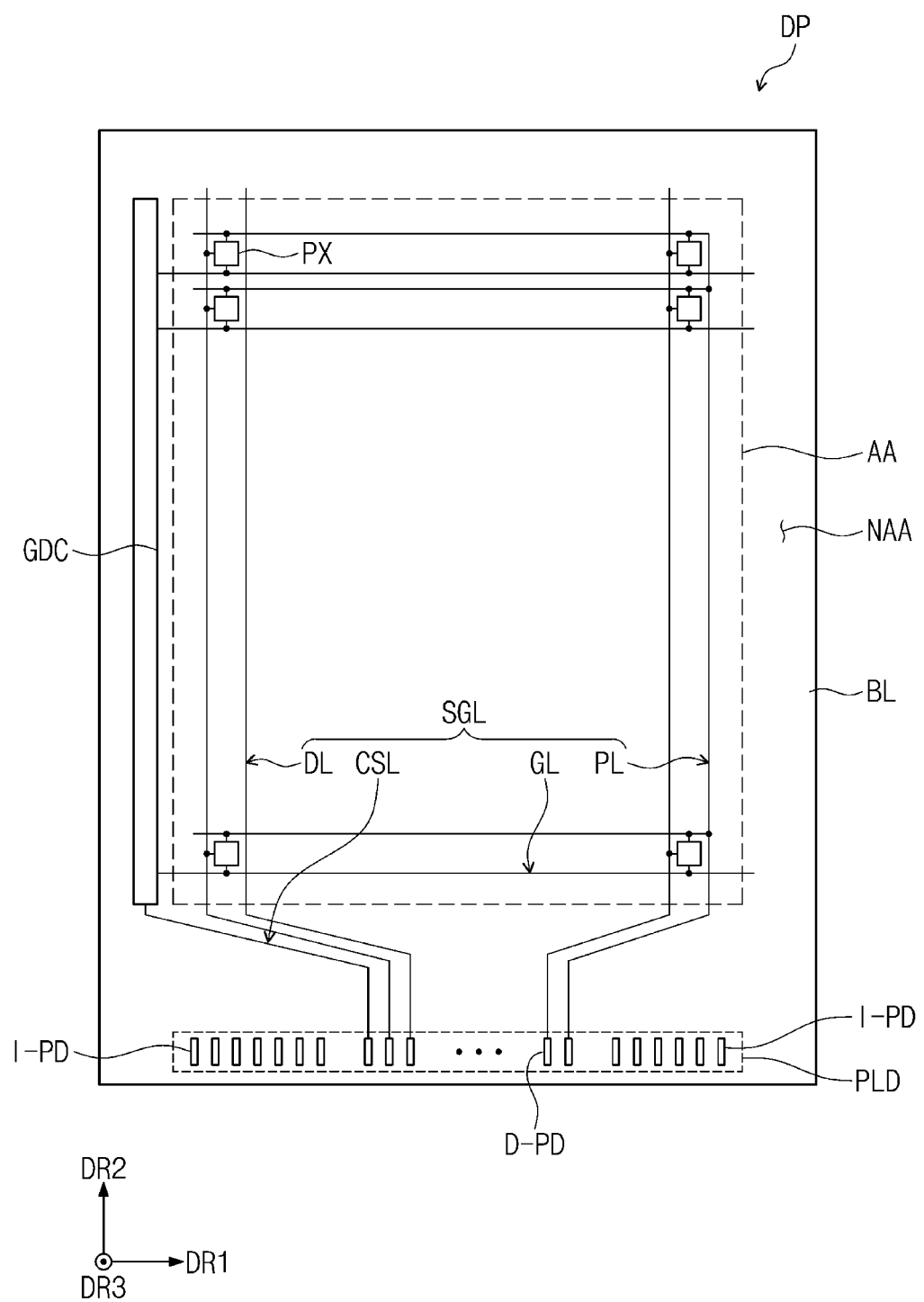
FIG. 2 is a plan view of a display panel according to an embodiment.
Figure 3:
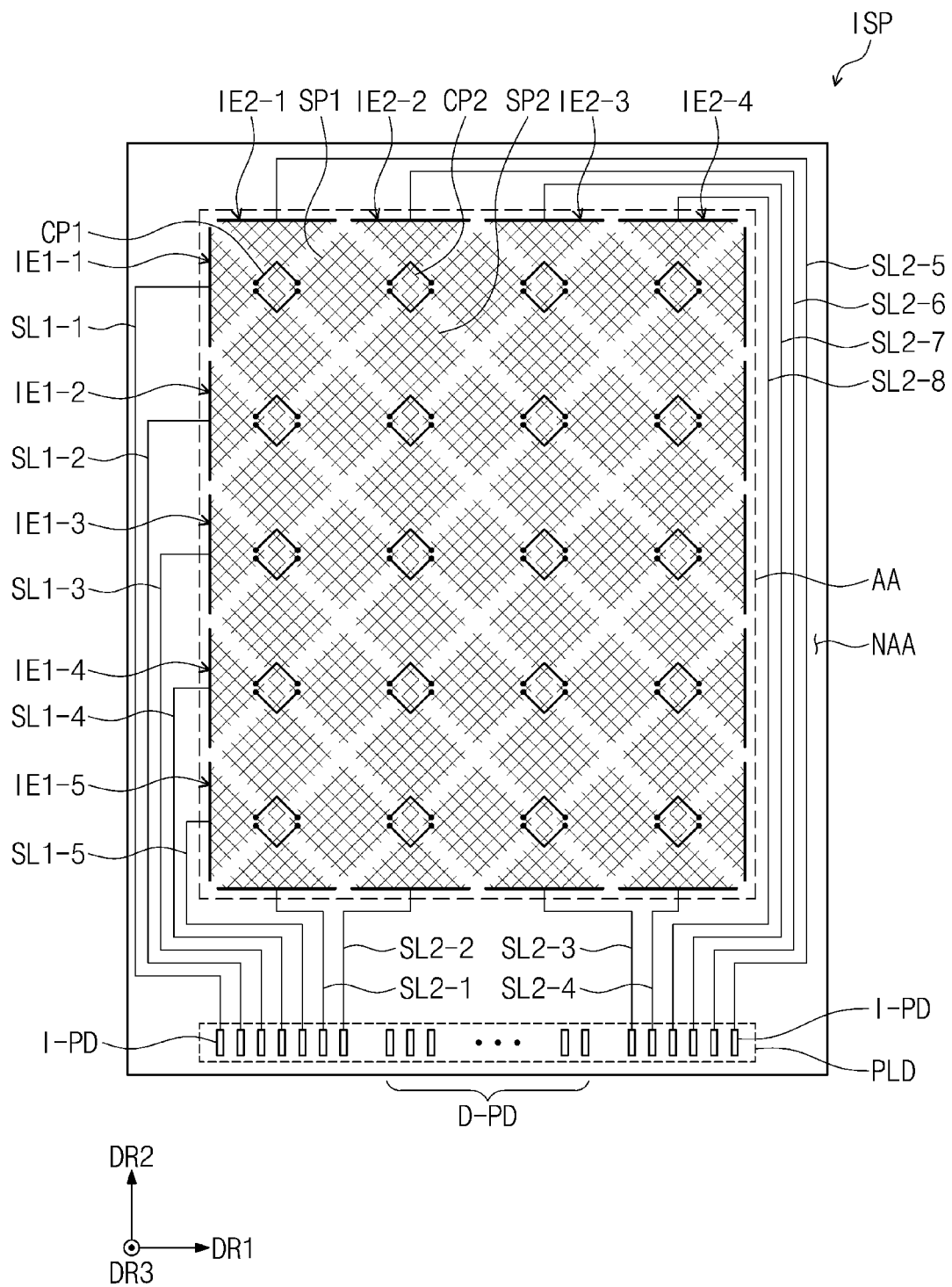
FIG. 3 is a plan view of an input sensing layer according to an embodiment.

FIG. 2 is a plan view of the display panel according to an embodiment, and FIG. 3 is a plan view of the input sensing layer according to an embodiment.

Referring to FIGS. 2 and 3, the display panel DP may include a drive circuit GDC, a plurality of signal lines SGL, and a plurality of pixels PX. The display panel DP may further include a pad PLD disposed on the peripheral area NAA. The pad PLD includes pixel pads D-PD connected with corresponding ones of the plurality of signal lines SGL.

The pixels PX are disposed on the active area AA. Each of the pixels PX includes a light emitting element 114 (refer to FIG. 24) and a pixel drive circuit connected thereto. The light emitting element 114 may include an organic light emitting diode. The drive circuit GDC, the signal lines SGL, the pad PLD, and the pixel drive circuit may be included in a circuit element layer 120 illustrated in FIG. 24.

The drive circuit GDC may include a gate drive circuit. The gate drive circuit generates a plurality of gate signals (hereinafter, referred to as the gate signals) and sequentially outputs the gate signals to a plurality of gate lines GL (hereinafter, referred to as the gate lines) to be described below. The gate drive circuit may additionally output another control signal to the pixel drive circuit.

The signal lines SGL include the gate lines GL, data lines DL, a power line PL, and a control signal line CSL. One of the gate lines GL is connected to a corresponding one of the pixels PX, and one of the data lines DL is connected to a corresponding one of the pixels PX. The power line PL is connected to the pixels PX. The control signal line CSL may supply control signals to the gate drive circuit. The signal lines SGL overlap the active area AA and the peripheral area NAA.

The pad PLD, to which the flexible circuit film FCB (illustrated in FIG. 1B) is connected, may include the pixel pads D-PD for electrically connecting the flexible circuit film FCB to the display panel DP and input pads I-PD for electrically connecting the flexible circuit film FCB to the input sensing layer ISP. The pixel pads D-PD and the input pads I-PD may be provided by exposing some of the interconnection wires disposed in the circuit element layer 120 from the insulating layer included in the circuit element layer 120.

The pixel pads D-PD are connected to the corresponding pixels PX through the signal lines SGL. Furthermore, the drive circuit GDC may be connected to one of the pixel pads D-PD.

Referring to FIG. 3, the input sensing layer ISP according to an embodiment may include first sensing electrodes IE1-1 to IE1-5, first signal lines SL1-1 to SL1-5 connected to the first sensing electrodes IE1-1 to 1E1-5, second sensing electrodes 1E2-1 to 1E2-4, and second signal lines SL2-1 to SL2-4 connected to the second sensing electrodes 1E2-1 to 1E2-4. In an embodiment, the input sensing layer ISP may include third signal lines SL2-5 to SL2-8 connected to the second sensing electrodes 1E2-1 to 1E2-4. In this case, each of the second signal lines SL2-1 to SL2-4 may be connected to one end of a corresponding one of the second sensing electrodes 1E2-1 to 1E2-4, and each of the third signal lines SL2-5 to SL2-8 may be connected to an opposite end of a corresponding one of the second sensing electrodes 1E2-1 to 1E2-4.

The first sensing electrodes 1E1-1 to 1E1-5 cross the second sensing electrodes 1E2-1 to 1E2-4. The first sensing electrodes IE1-1 to 1E1-5 and the second sensing electrodes 1E2-1 to 1E2-4 are insulated from each other to form mutual capacitance. The first sensing electrodes IE1-1 to 1E1-5 are arranged in the second direction DR2 and extend in the first direction DR1. The second sensing electrodes 1E2-1 to 1E2-4 are arranged in the first direction DR1 and extend in the second direction DR2.

Each of the first sensing electrodes IE1-1 to 1E1-5 includes first sensor parts SP1 and first connecting parts CP1 disposed on the active area AA. Each of the second sensing electrodes 1E2-1 to 1E2-4 includes second sensor parts SP2 and second connecting parts CP2 disposed on the active area AA. Two first sensor parts disposed at opposite ends of the first sensing electrode among the first sensor parts SP1 may have a smaller size than a first sensor part disposed at the center of the first sensing electrode. For example, the two first sensor parts may be half the size of the first sensor part disposed at the center of the first sensing electrode. Two second sensor parts disposed at opposite ends of the second sensing electrode among the second sensor parts SP2 may have a smaller size than a second sensor part disposed at the center of the second sensing electrode. For example, the two second sensor parts may be half the size of the second sensor part disposed at the center of the second sensing electrode.

Although FIG. 3 illustrates the first sensing electrodes 1E1-1 to 1E1-5 and the second sensing electrodes 1E2-1 and 1E2-4 according to one embodiment, the shapes thereof are not limited thereto. In an embodiment, the first sensing electrodes 1E1-1 to 1E1-5 and the second sensing electrodes 1E2-1 and 1E2-4 may have a shape (e.g., a bar shape) in which sensor parts and connecting parts are not distinguished from each other. In FIG. 3, the first sensor parts SP1 and the second sensor parts SP2 are illustrated as having a rhombic shape. However, without being limited thereto, the first sensor parts SP1 and the second sensor parts SP2 may have different polygonal shapes.

In one first sensing electrode, first sensor parts SP1 are arranged along the first direction DR1, and in one second sensing electrode, second sensor parts SP2 are arranged along the second direction DR2. Each of the first connecting parts CP1 connects first sensor parts SP1 adjacent to each other, and each of the second connecting parts CP2 connects second sensor parts SP2 adjacent to each other.

The first sensing electrodes 1E1-1 to 1E1-5 and the second sensing electrodes 1E2-1 to 1E2-4 may have a mesh form. As the first sensing electrodes 1E1-1 to 1E1-5 and the second sensing electrodes 1E2-1 to 1E2-4 have the mesh form, parasitic capacitance with electrodes of the display panel DP (refer to FIG. 2) may be decreased.

The first sensing electrodes 1E1-1 to 1E1-5 and the second sensing electrodes 1E2-1 to 1E2-4 having the mesh form may contain silver, aluminum, copper, chromium, nickel, titanium, or the like that is able to be subjected to a low-temperature process, but are not limited thereto. Even though the input sensing layer ISP is formed by a continuous process, damage to the light emitting element 114 (refer to FIG. 24) may be prevented.

Each of the first signal lines SL1-1 to SL1-5 is connected to one end of a corresponding one of the first sensing electrodes IE1-1 to IE1-5. In an embodiment, the input sensing layer ISP may further include signal lines, each of which is connected to an opposite end of a corresponding one of the first sensing electrodes IE1-1 to IE1-5.

The first signal lines SL1-1 to SL1-5, the second signal lines SL2-1 to SL2-4, and the third signal lines SL2-5 to SL2-8 may be disposed on the peripheral area NAA. The pad PLD may include the input pads I-PD that extend from ends of the first signal lines SL1-1 to SL1-5, the second signal lines SL2-1 to SL2-4, and the third signal lines SL2-5 to SL2-8 and that are disposed on the peripheral area NAA.

Figure 4A:
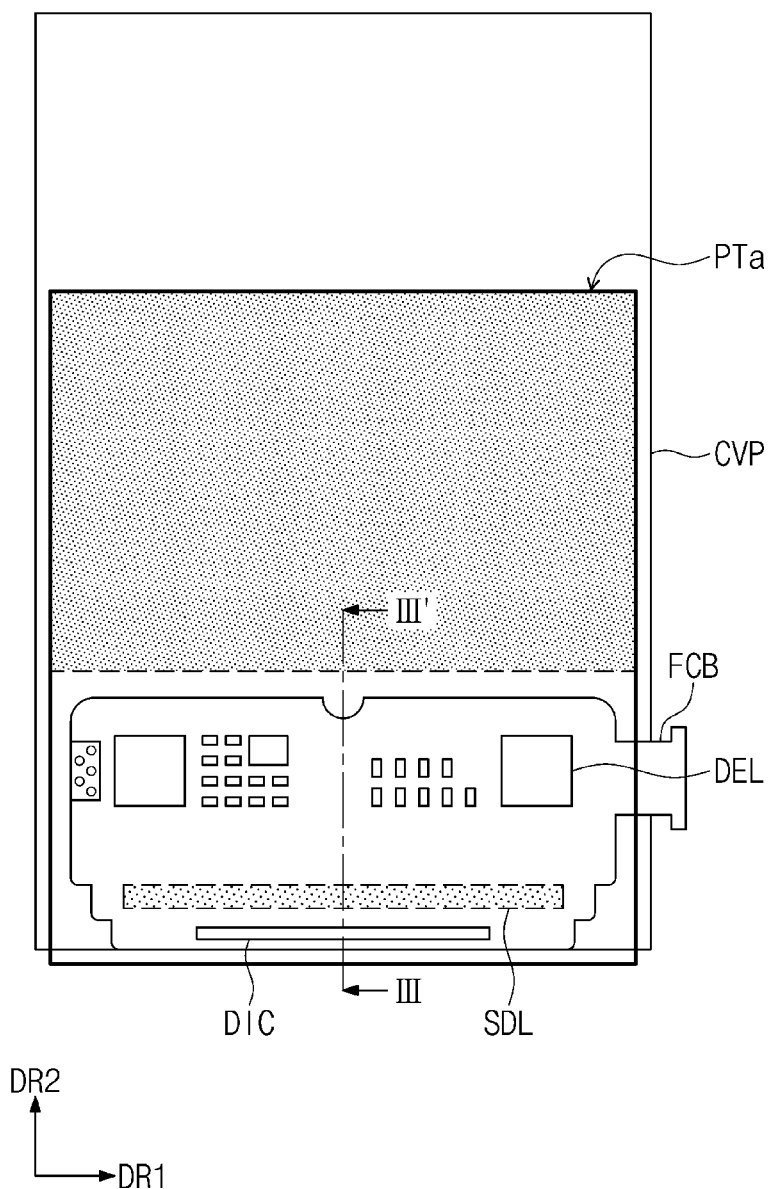
FIG. 4A is a rear view of the display device according to an embodiment.
Figure 4B:
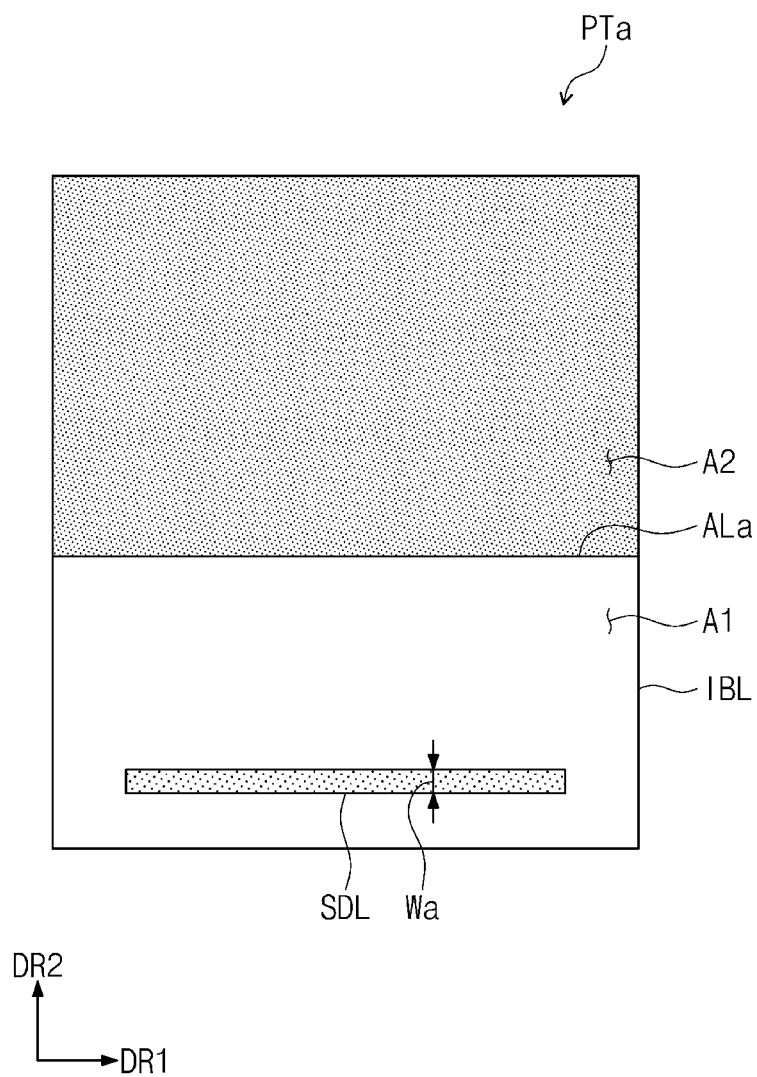
FIG. 4B is a plan view of a protection tape illustrated in FIG. 4A.
Figure 5:
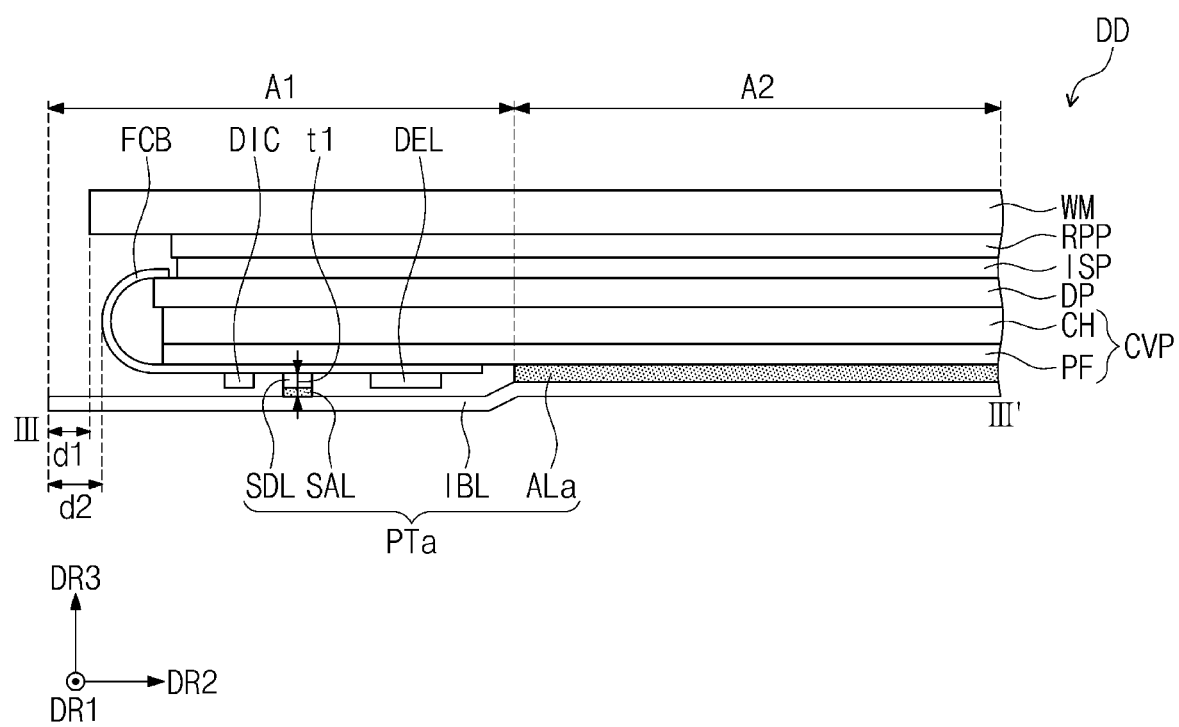
FIG. 5 is a sectional view taken along line III'-III' in FIG. 4A.

FIG. 4A is a rear view of the display device according to an embodiment. FIG. 4B is a plan view of the protection tape illustrated in FIG. 4A. FIG. 5 is a sectional view taken along line III'-III' in FIG. 4A.

Referring to FIGS. 4A to 5, the cover panel CVP is disposed on the rear surface of the display panel DP. The cover panel CVP includes a shock absorbing layer CH and a protection layer PF.

The cover panel CVP may include the protection layer PF and the shock absorbing layer CH. The protection layer PF may be a polyimide (PI) film. The shock absorbing layer CH may be disposed on the rear surface of the display panel DP and may improve the impact resistance of the display device DD. The shock absorbing layer CH may be disposed between the display panel DP and the protection layer PF.

This is illustrative, and at least one of the shock absorbing layer CH or the protection layer PF may be omitted in some implementations of this embodiment. Furthermore, in addition to the shock absorbing layer CH and the protection layer PF, another functional layer (e.g., a heat radiating layer) may be added to the cover panel CVP, or an adhesive layer for a coupling of the shock absorbing layer CH and the protection layer PF may be added to the cover panel CVP.

The flexible circuit film FCB may be coupled to the peripheral area NAA of the display panel DP through a bonding process. The driving chip DIC may be mounted on the flexible circuit film FCB. One side of the flexible circuit film FCB is bent to surround a side surface of the display panel DP, and an opposite side of the flexible circuit film FCB is disposed on the rear surface of the cover panel CVP. In this case, the driving chip DIC and the driving elements DEL may be disposed on the rear surface of the cover panel CVP.

The protection tape PTa may be disposed on the rear surface of the cover panel CVP and may cover the flexible circuit film FCB. The protection tape PTa may have a quadrilateral tape shape. However, the shape of the protection tape PTa is not limited thereto. The protection tape PTa may be implemented in various shapes having a size sufficient to cover the flexible circuit film FCB.

The protection tape PTa includes the insulating base layer IBL, the adhesive layer ALa, the step layer SDL, and the sub-adhesive layer SAL. The insulating base layer IBL may include the first area A1 and the second area A2. Here, the first area A1 may be defined as an area overlapping the flexible circuit film FCB on the plane, and the second area A2 may be defined as an area not overlapping the flexible circuit film FCB on the plane.

The adhesive layer ALa is disposed on the insulating base layer IBL in the second area A2. Particularly, the adhesive layer ALa is disposed between the insulating base layer IBL and the cover panel CVP in the second area A2. The adhesive layer ALa is disposed so as not to overlap the flexible circuit film FCB on the plane.

The step layer SDL is disposed on the insulating base layer IBL in the first area A1. The step layer SDL may have a first width Wa in the second direction DR2. In an embodiment, the step layer SDL may be disposed in a position not overlapping the driving chip DIC and the driving elements DEL on the plane. Accordingly, shocks may be prevented from being transmitted to the driving chip DIC and the driving elements DEL through the step layer SDL to cause damage to the driving chip DIC and the drive elements DEL.

The step layer SDL and the insulating base layer IBL are not integrally formed with each other. That is, the sub-adhesive layer SAL is disposed between the step layer SDL and the insulating base layer IBL. However, the step layer SDL and the insulating base layer IBL may contain the same material. For example, the step layer SDL and the insulating base layer IBL may contain at least one of polyethylene terephthalate (PET), polyimide (PI), polyamide (PAI), polyethylene naphthalate (PEN), or polycarbonate (PC).

The sub-adhesive layer SAL may contain the same material as the adhesive layer ALa. The sub-adhesive layer SAL and the adhesive layer ALa may contain a pressure sensitive adhesive (PSA), an optical clear adhesive (OCA), or an optical clear resin (OCR).

The sum of the thickness of the step layer SDL and the thickness of the sub-adhesive layer SAL (hereinafter, referred to as the thickness t1 of a step portion) may be greater than the thickness of a part having the greatest thickness among the driving chip DIC and the driving elements DEL. Accordingly, the upper surface of the step layer SDL may make contact with the upper surface of the flexible circuit film FCB, but the driving chip DIC and the driving elements DEL may not make contact with the upper surface of the insulating base layer IBL. Thus, the driving chip DIC and the driving elements DEL may be prevented from being damaged by contact or friction with the protection tape PTa. In an embodiment, the thickness t1 of the step portion may range from about 1 mm to about 1.5 mm.

The thickness of the step layer SDL may be greater than or equal to the thickness of the insulating base layer IBL. When the driving chip DIC and the driving elements DEL are thick, the thickness of the step layer SDL or the sub-adhesive layer SAL may be adjusted to secure the thickness t1 of the step portion.

An end of the protection tape PTa may be located outward of an end of the window WM. The gap between the end of the protection tape PTa and the end of the window WM (hereinafter, referred to as the first gap d1) may range from about 1 mm to about 2 mm.

As the end of the protection tape PTa is located outward of the end of the window WM (that is, the end of the protection tape PTa is located further away from a center of the display device than the end of the window WM), the protection tape PTa may protect the bent portion of the flexible circuit film FCB. The end of the window WM may be located outward of the bent portion of the flexible circuit film FCB. When the gap between the end of the protection tape PTa and the bent portion of the flexible circuit film FCB is defined as the second gap d2, the second gap d2 may be greater than the first gap d1. As the gap d1 between the end of the protection tape PTa and the end of the window WM and the gap d2 between the end of the protection tape PTa and the bent portion of the flexible circuit film FCB are ensured, the bent portion of the flexible circuit film FCB may be protected in the process of transporting the display device DD to fabricate the electronic device ED (refer to FIG. 1A).

The protection tape PTa may have a standardized shape irrespective of the shape and position of the flexible circuit film FCB. That is, the protection tape PTa may be commonly used for different types of display devices DD. Accordingly, the time spent fabricating the protection tape PTa and the manufacturing cost may be reduced.

Figure 6:
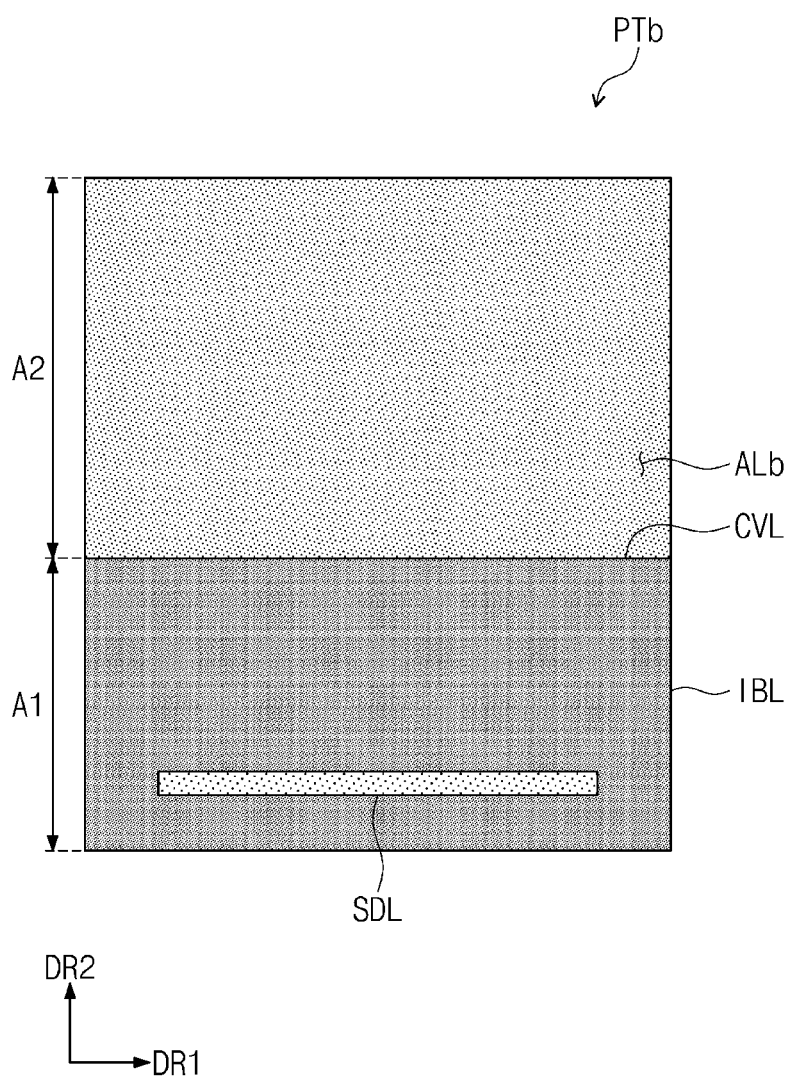
FIG. 6 is a plan view of a protection tape according to an embodiment.
Figure 7:
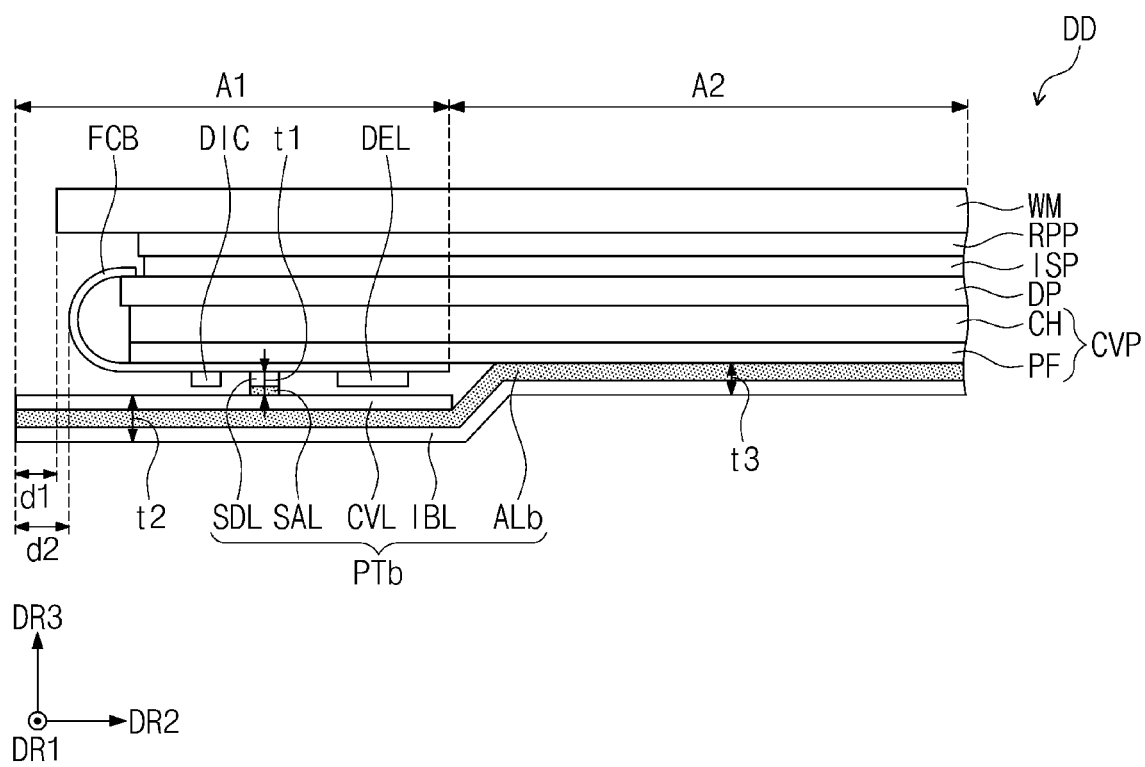
FIG. 7 is a sectional view of the display device employing the protection tape illustrated in FIG. 6.

FIG. 6 is a plan view of a protection tape according to an embodiment, and FIG. 7 is a sectional view of the display device employing the protection tape illustrated in FIG. 6. Among the components illustrated in FIGS. 6 and 7, components identical to the components illustrated in FIGS. 4A to 5 will be assigned with identical reference numerals, and specific descriptions thereabout will be omitted for ease in explanation of these figures.

Referring to FIGS. 6 and 7, the protection tape PTb includes an insulating base layer IBL, an adhesive layer ALb, a cover layer CVL, a step layer SDL, and a sub-adhesive layer SAL. The insulating base layer IBL may include a first area A1 and a second area A2. Here, the first area A1 may be defined as an area overlapping the flexible circuit film FCB on the plane, and the second area A2 may be defined as an area not overlapping the flexible circuit film FCB on the plane.

The adhesive layer ALb is disposed on the insulating base layer IBL in the first and second areas A1 and A2. That is, the adhesive layer ALb is formed on the entire upper surface of the insulating base layer IBL. In this case, the adhesive layer ALb may be disposed to overlap the flexible circuit film FCB on the plane.

The cover layer CVL is disposed on the adhesive layer ALb in the first area A1. The cover layer CVL may contain an insulating material. The cover layer CVL may contain the same material as the insulating base layer IBL and the step layer SDL. For example, the cover layer CVL may contain at least one of polyethylene terephthalate (PET), polyimide (PI), polyamide (PAI), polyethylene naphthalate (PEN), or polycarbonate (PC).

The step layer SDL is disposed over the cover layer CVL. In an embodiment, the step layer SDL may be disposed in a position not overlapping the driving chip DIC and the driving elements DEL on the plane. Accordingly, shocks may be prevented from being transmitted to the driving chip DIC and the driving elements DEL through the step layer SDL to cause damage to the driving chip DIC and the driving elements DEL.

The step layer SDL and the cover layer CVL are not integrally formed with each other. That is, the sub-adhesive layer SAL is disposed between the step layer SDL and the cover layer CVL.

The sum of the thickness of the step layer SDL and the thickness of the sub-adhesive layer SAL (hereinafter, referred to as the thickness t1 of the step portion) may be greater than the thickness of a part having the greatest thickness among the driving chip DIC and the driving elements DEL. Accordingly, the upper surface of the step layer SDL may make contact with the upper surface of the flexible circuit film FCB, but the driving chip DIC and the driving elements DEL may not make contact with the upper surface of the insulating base layer IBL. Thus, the driving chip DIC and the driving elements DEL may be prevented from being damaged by contact or friction with the protection tape PTb. In an embodiment, the thickness t1 of the step portion may range from about 1 mm to about 1.5 mm.

The thickness of the step layer SDL may be greater than or equal to the thickness of the insulating base layer IBL or the cover layer CVL. When the driving chip DIC and the driving elements DEL are thick, the thickness of the step layer SDL or the sub-adhesive layer SAL may be adjusted to secure the thickness t1 of the step portion.

An end of the protection tape PTb may be located outward of an end of the window WM. The gap between the end of the protection tape PTb and the end of the window WM (hereinafter, referred to as the first gap d1) may range from about 1 mm to about 2 mm.

As the end of the protection tape PTb is located outward of the end of the window WM, the protection tape PTb may protect the bent portion of the flexible circuit film FCB. The end of the window WM may be located outward of the bent portion of the flexible circuit film FCB. When the gap between the end of the protection tape PTb and the bent portion of the flexible circuit film FCB is defined as the second gap d2, the second gap d2 may be greater than the first gap d1.

In an embodiment, the thickness of the protection tape PTb in the first area A1 (hereinafter, referred to as the first thickness t2) may be greater than the thickness of the protection tape PTb in the second area A2 (hereinafter, referred to as the second thickness t3).

Figure 8:
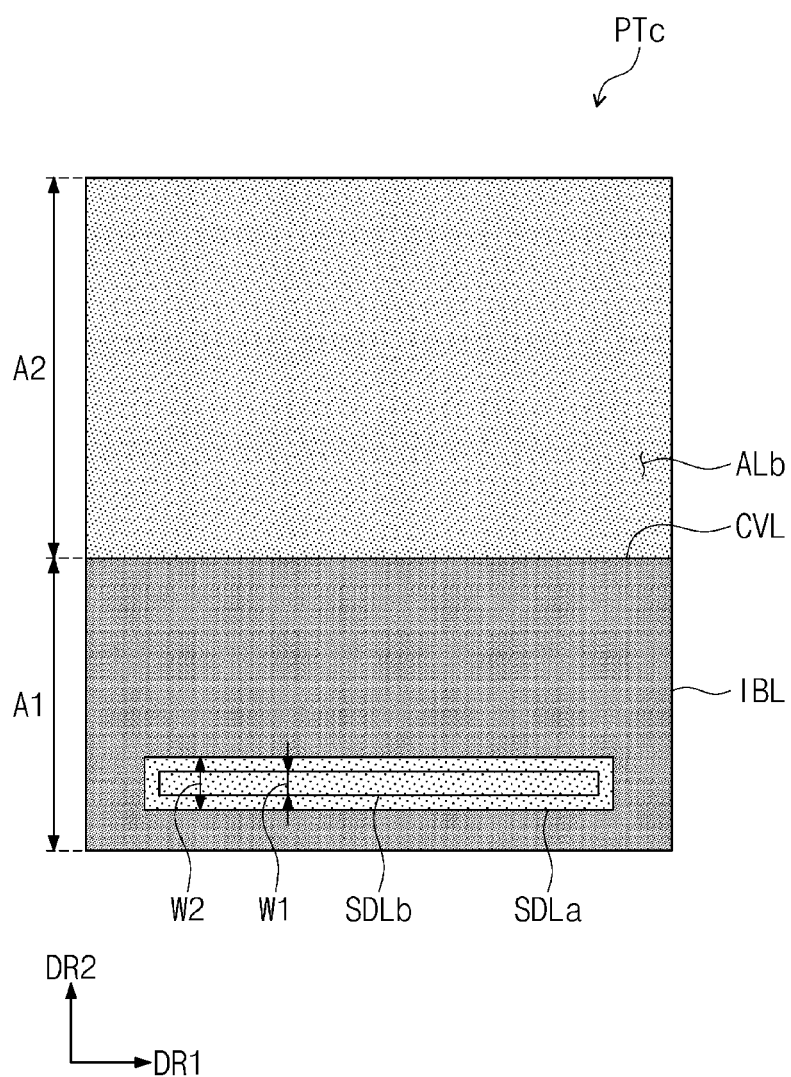
FIG. 8 is a plan view of a protection tape according to an embodiment.
Figure 9:
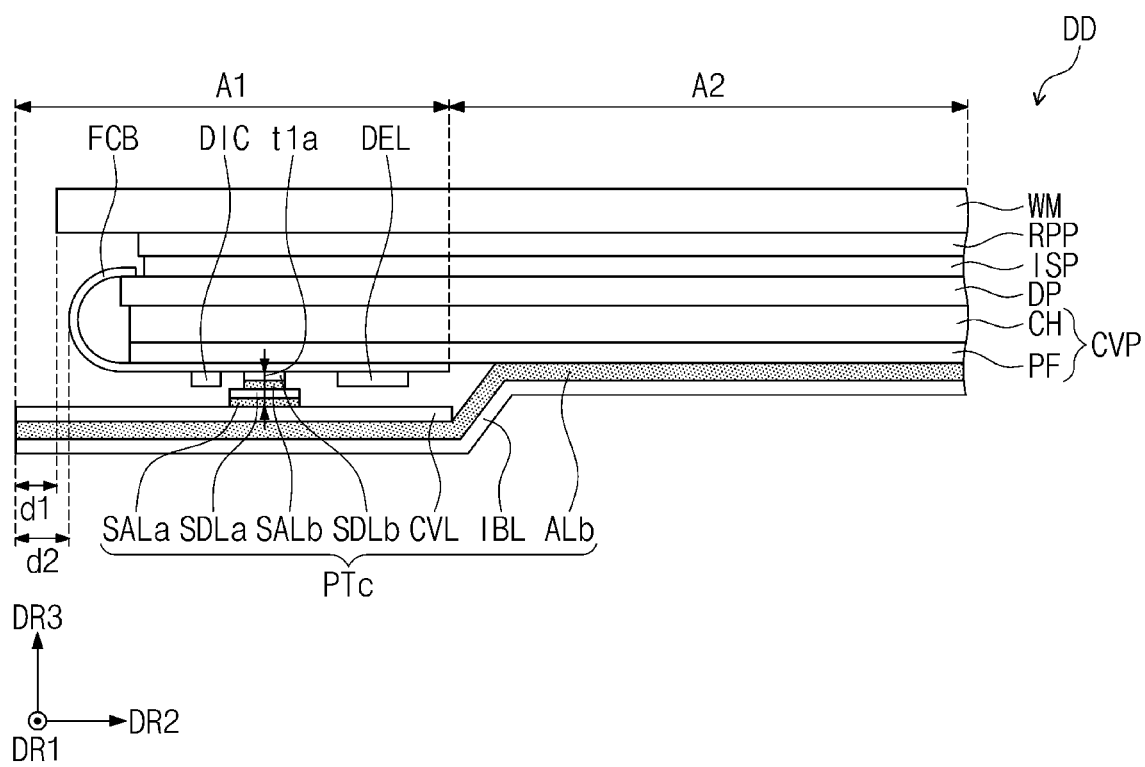
FIG. 9 is a sectional view of the display device employing the protection tape illustrated in FIG. 8.

FIG. 8 is a plan view of a protection tape according to an embodiment, and FIG. 9 is a sectional view of the display device employing the protection tape illustrated in FIG. 8. Among the components illustrated in FIGS. 8 and 9, components identical to the components illustrated in FIGS. 6 and 7 will be assigned with identical reference numerals, and specific descriptions thereabout will be omitted for ease in explanation of these figures.

Referring to FIGS. 8 and 9, the protection tape PTc includes an insulating base layer IBL, an adhesive layer ALb, a cover layer CVL, a first step layer SDLa, a second step layer SDLb, a first sub-adhesive layer SALa, and a second sub-adhesive layer SALb.

The insulating base layer IBL may include a first area A1 and a second area A2. Here, the first area A1 may be defined as an area overlapping the flexible circuit film FCB on the plane, and the second area A2 may be defined as an area not overlapping the flexible circuit film FCB on the plane.

The adhesive layer ALb is disposed on the insulating base layer IBL in the first and second areas A1 and A2. That is, the adhesive layer ALb is formed on the entire upper surface of the insulating base layer IBL.

The cover layer CVL is disposed on the adhesive layer ALb in the first area A1. The cover layer CVL may contain the same insulating material as the insulating base layer IBL.

The first step layer SDLa is disposed over the cover layer CVL. In an embodiment, the first step layer SDLa may be disposed in a position not overlapping the driving chip DIC and the driving elements DEL on the plane. The first step layer SDLa and the cover layer CVL are not integrally formed with each other. That is, the first sub-adhesive layer SALa is disposed between the first step layer SDLa and the cover layer CVL. Accordingly, the first step layer SDLa may be coupled to the upper surface of the cover layer CVL by the first sub-adhesive layer SALa.

The second step layer SDLb is disposed over the first step layer SDLa. The second sub-adhesive layer SALb is disposed between the first step layer SDLa and the second step layer SDLb. Accordingly, the second step layer SDLb may be coupled to the upper surface of the first step layer SDLa by the second sub-adhesive layer SALb.

In an embodiment, the width W1 of the second step layer SDLb in the second direction DR2 may be smaller than or equal to the width W2 of the first step layer SDLa in the second direction DR2. The thickness of the second step layer SDLb in the third direction DR3 may be equal to, or different from, the thickness of the first step layer SDLa in the third direction DR3.

The sum of the thicknesses of the first and second step layers SDLa and SDLb and the thicknesses of the first and second sub-adhesive layers SALa and SALb (hereinafter, referred to as the thickness t1a of the step portion) may be greater than the thickness of a part having the greatest thickness among the driving chip DIC and the driving elements DEL. Accordingly, the upper surface of the second step layer SDLb may make contact with the upper surface of the flexible circuit film FCB, but the driving chip DIC and the driving elements DEL may not make contact with the upper surface of the insulating base layer IBL. Thus, the driving chip DIC and the driving elements DEL may be prevented from being damaged by contact or friction with the protection tape PTc. In an embodiment, the thickness t1a of the step portion may range from about 1 mm to about 1.5 mm.

The thicknesses of the first and second step layers SDLa and SDLb or the first and second sub-adhesive layers SALa and SALb may be adjusted to secure the desired thickness t1a of the step portion. Alternatively, the numbers of step layers and sub-adhesive layers provided in the step may be adjusted to secure the desired thickness t1a of the step portion.

Figure 10:
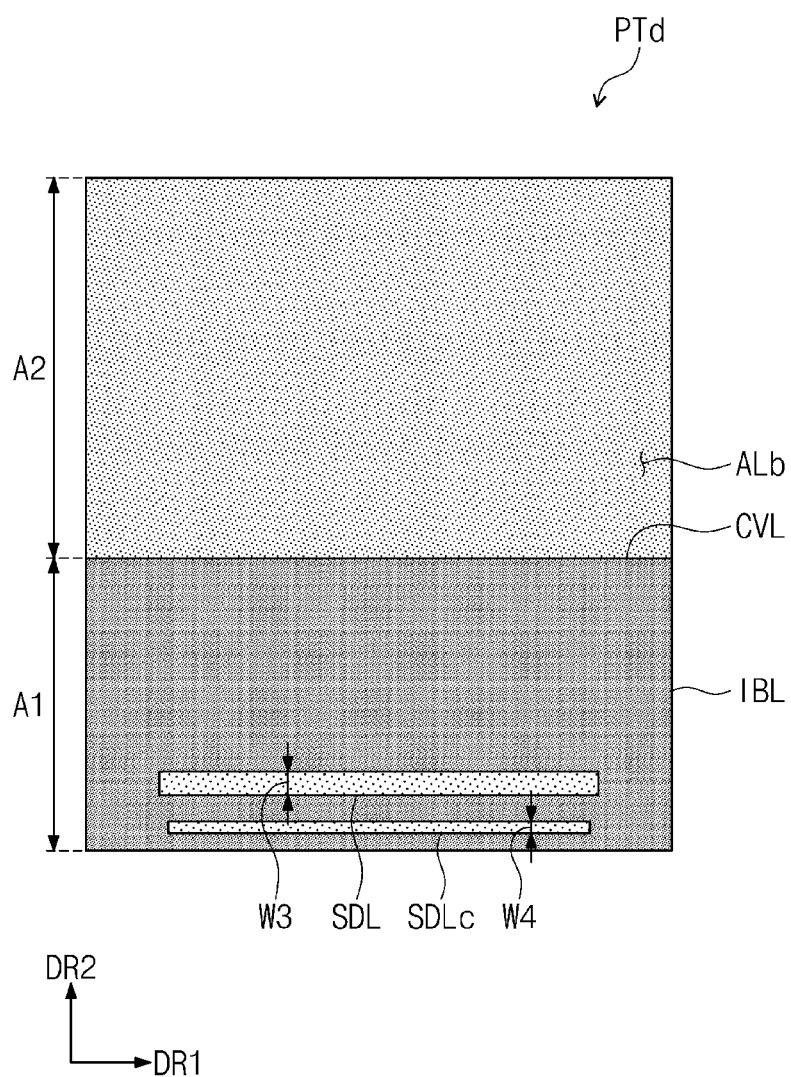
FIG. 10 is a plan view of a protection tape according to an embodiment.
Figure 11:
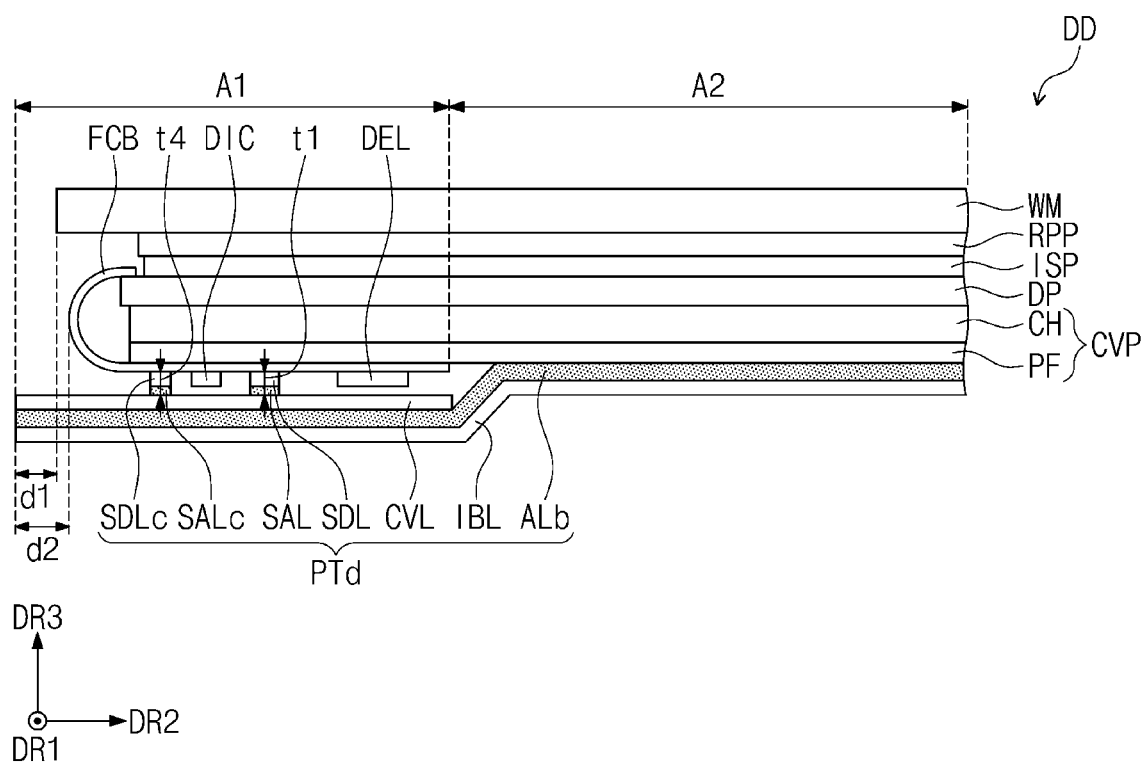
FIG. 11 is a sectional view of the display device employing the protection tape illustrated in FIG. 10.

FIG. 10 is a plan view of a protection tape according to an embodiment, and FIG. 11 is a sectional view of the display device employing the protection tape illustrated in FIG. 10. Among the components illustrated in FIGS. 10 and 11, components identical to the components illustrated in FIGS. 6 and 7 will be assigned with identical reference numerals, and specific descriptions thereabout will be omitted for ease in explanation of these figures.

Referring to FIGS. 10 and 11, the protection tape PTd includes an insulating base layer IBL, an adhesive layer ALb, a cover layer CVL, a step layer SDL, a dummy step layer SDLc, a sub-adhesive layer SAL, and a dummy sub-adhesive layer SALc.

The insulating base layer IBL may include a first area A1 and a second area A2. Here, the first area A1 may be defined as an area overlapping the flexible circuit film FCB on the plane, and the second area A2 may be defined as an area not overlapping the flexible circuit film FCB on the plane.

The adhesive layer ALb is disposed on the insulating base layer IBL in the first and second areas A1 and A2. That is, the adhesive layer ALb is formed on the entire upper surface of the insulating base layer IBL.

The cover layer CVL is disposed on the adhesive layer ALb in the first area A1. The cover layer CVL may contain the same insulating material as the insulating base layer IBL.

The step layer SDL is disposed over the cover layer CVL. In an embodiment, the step layer SDL may be disposed in a position not overlapping the driving chip DIC and the driving elements DEL on the plane. The step layer SDL and the cover layer CVL are not integrally formed with each other. That is, the sub-adhesive layer SAL is disposed between the step layer SDL and the cover layer CVL. Accordingly, the step layer SDL may be coupled to the upper surface of the cover layer CVL by the sub-adhesive layer SAL.

The dummy step layer SDLc is disposed closer to the bent portion of the flexible circuit film FCB than the step layer SDL. The dummy sub-adhesive layer SALc is disposed between the cover layer CVL and the dummy step layer SDLc. The dummy step layer SDLc may be coupled to the upper surface of the cover layer CVL by the dummy sub-adhesive layer SALc. In an embodiment, the width W4 of the dummy step layer SDLc in the second direction DR2 may be smaller than or equal to the width W3 of the step layer SDL in the second direction DR2.

The sum of the thickness of the step layer SDL and the thickness of the sub-adhesive layer SAL (hereinafter, referred to as the thickness t1 of the step portion) may be greater than the thickness of a part having the greatest thickness among the driving chip DIC and the driving elements DEL. Accordingly, the upper surface of the step layer SDL may make contact with the upper surface of the flexible circuit film FCB, but the driving chip DIC and the driving elements DEL may not make contact with the upper surface of the insulating base layer IBL. The sum of the thickness of the dummy step layer SDLc and the thickness of the dummy sub-adhesive layer SALc (hereinafter, referred to as the thickness t4 of the dummy step) may be smaller than or equal to the thickness t1 of the step portion. Accordingly, the upper surface of the step layer SDL may make contact with the upper surface of the flexible circuit film FCB, but the upper surface of the dummy step layer SDLc may or may not make contact with the upper surface of the flexible circuit film FCB.

Figure 12A:
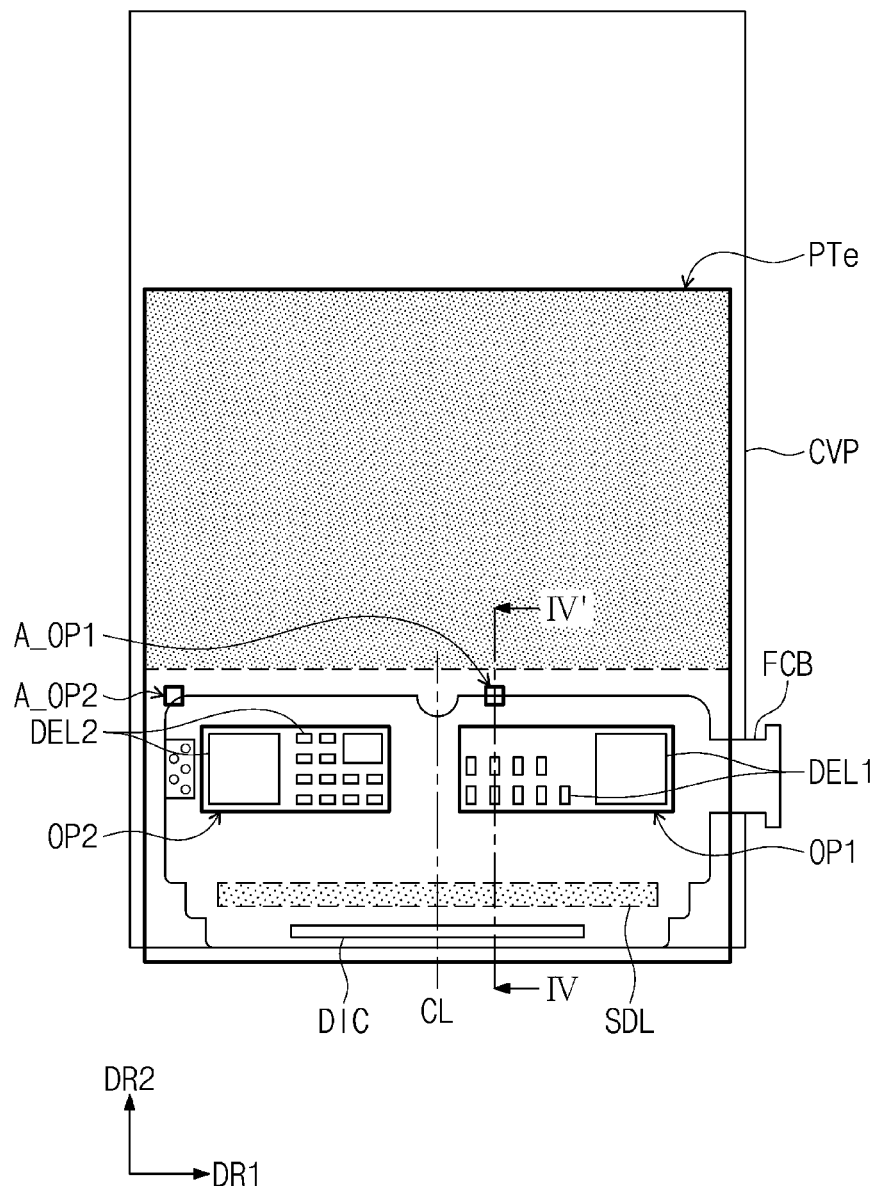
FIG. 12A is a rear view of a display device according to an embodiment.
Figure 12B:
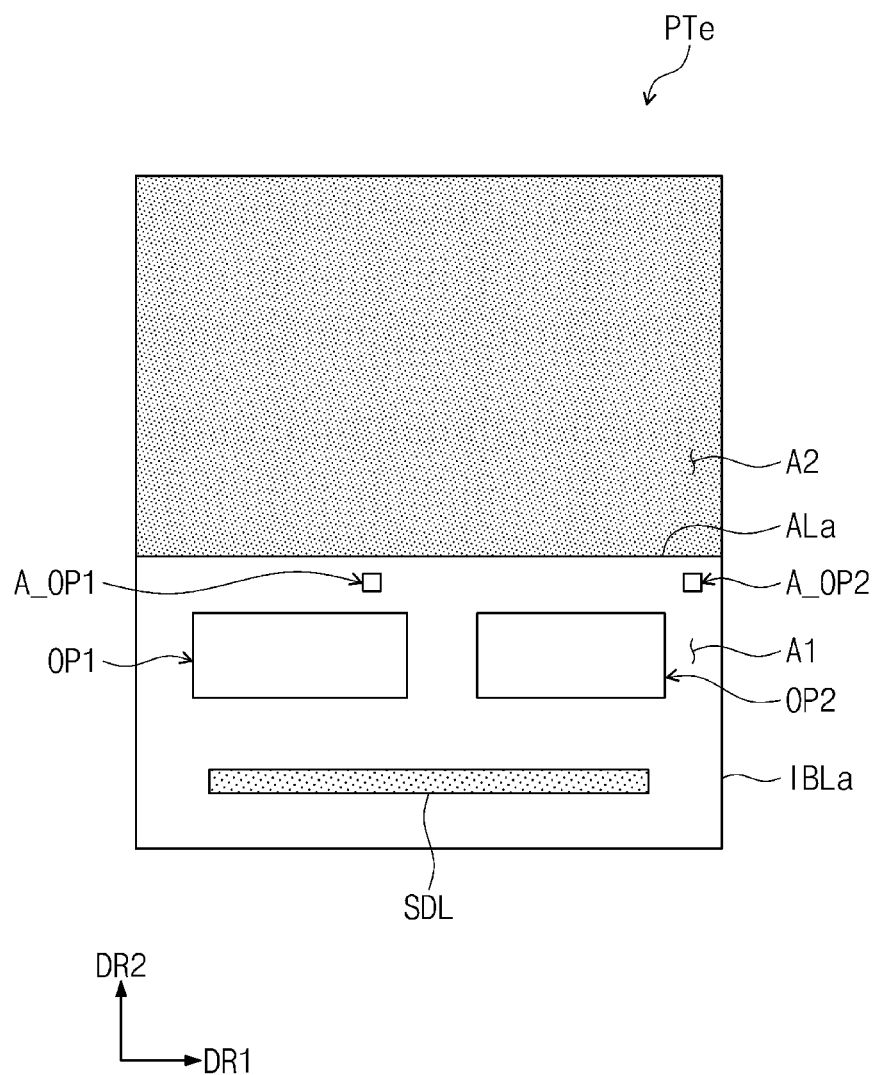
FIG. 12B is a plan view of a protection tape illustrated in FIG. 12A.
Figure 12C:
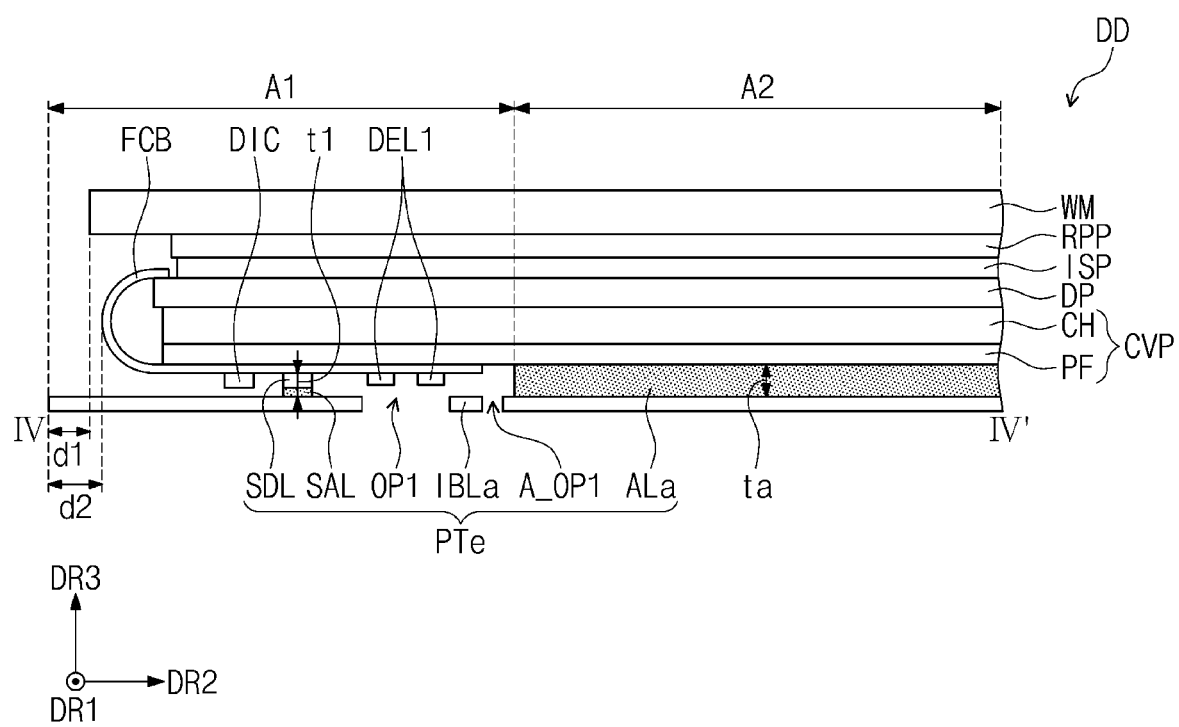
FIG. 12C is a sectional view taken along line IV-IV' in FIG. 12A.

FIG. 12A is a rear view of a display device according to an embodiment. FIG. 12B is a plan view of a protection tape illustrated in FIG. 12A. FIG. 12C is a sectional view taken along line IV-IV' in FIG. 12A. Among the components illustrated in FIGS. 12A to 12C, components identical to the components illustrated in FIGS. 4A to 5 will be assigned with identical reference numerals, and specific descriptions thereabout will be omitted for ease in explanation of these figures.

Referring to FIGS. 12A to 12C, the protection tape PTe includes an insulating base layer IBLa, an adhesive layer ALa, a step layer SDL, and a sub-adhesive layer SAL. The insulating base layer IBLa may include a first area A1 and a second area A2. Here, the first area A1 may be defined as an area overlapping a flexible circuit film FCB on the plane, and the second area A2 may be defined as an area not overlapping the flexible circuit film FCB on the plane.

The insulating base layer IBLa may include first and second openings OP1 and OP2 formed in the first area A1. The flexible circuit film FCB may include first driving elements DEL1 disposed on a first side (e.g., the right side) and second driving elements DEL2 disposed on a second side (e.g., the left side) with respect to a center line CL of the flexible circuit film FCB that is parallel to the second direction DR2. The first opening OP1 of the insulating base layer IBLa is formed through the insulating base layer IBLa in a position corresponding to the first driving elements DEL1. The second opening OP2 of the insulating base layer IBLa is formed through the insulating base layer IBLa in a position corresponding to the second driving elements DEL2.

Accordingly, after the protection tape PTe is coupled to the flexible circuit film FCB and the rear surface of a cover panel CVP, the first driving elements DEL1 may be exposed through the first opening OP1 of the insulating base layer IBLa, and the second drive elements DEL2 may be exposed through the second opening OP2 of the insulating base layer IBLa.

Although FIGS. 12A to 12C illustrate the structure in which the two openings OP1 and OP2 are formed in the insulating base layer IBLa, the present disclosure is not limited thereto. For example, the first and second openings OP1 and OP2 may be connected with each other to form one opening. Furthermore, the positions, shapes, and numbers of first and second openings OP1 and OP2 may be adjusted depending on the arrangement of the first and second drive elements DEL1 and DEL2.

The insulating base layer IBLa may further include first and second alignment openings A_OP1 and A_OP2 formed in the first area A1. The first alignment hole A_OP1 may be disposed on the first side with respect to the center line CL, and the second alignment hole A_OP2 may be disposed on the second side with respect to the center line CL.

As the flexible circuit film FCB disposed under the protection tape PTe is visible through the first and second alignment holes A_OP1 and A_OP2, the protection tape PTe may be easily aligned with the flexible circuit film FCB when coupled to the cover panel CVP. Accordingly, misalignment between the protection tape PTe and the flexible circuit film FCB may be prevented in the process of coupling the protection tape PTe to the cover panel CVP. Alignment marks may be additionally provided on the flexible circuit film FCB to correspond to the first and second alignment holes A_OP1 and A_OP2.

The adhesive layer ALa is disposed on the insulating base layer IBLa in the second area A2. Particularly, the adhesive layer ALa is disposed between the insulating base layer IBLa and the cover panel CVP in the second area A2. The adhesive layer ALa is disposed so as not to overlap the flexible circuit film FCB on the plane.

The step layer SDL is disposed over the insulating base layer IBLa in the first area A1. The step layer SDL may be spaced apart from the first and second openings OP1 and OP2. In an embodiment, the step layer SDL may be disposed in a position not overlapping a driving chip DIC and the first and second driving elements DEL1 and DEL2 on the plane. The sub-adhesive layer SAL is disposed between the step layer SDL and the insulating base layer IBLa. Accordingly, the step layer SDL may be coupled to the upper surface of the insulating base layer IBLa by the sub-adhesive layer SAL.

The sum of the thickness of the step layer SDL and the thickness of the sub-adhesive layer SAL (that is, the thickness t1 of the step portion) may be smaller than the thickness to of the adhesive layer ALa.

Figure 13A:
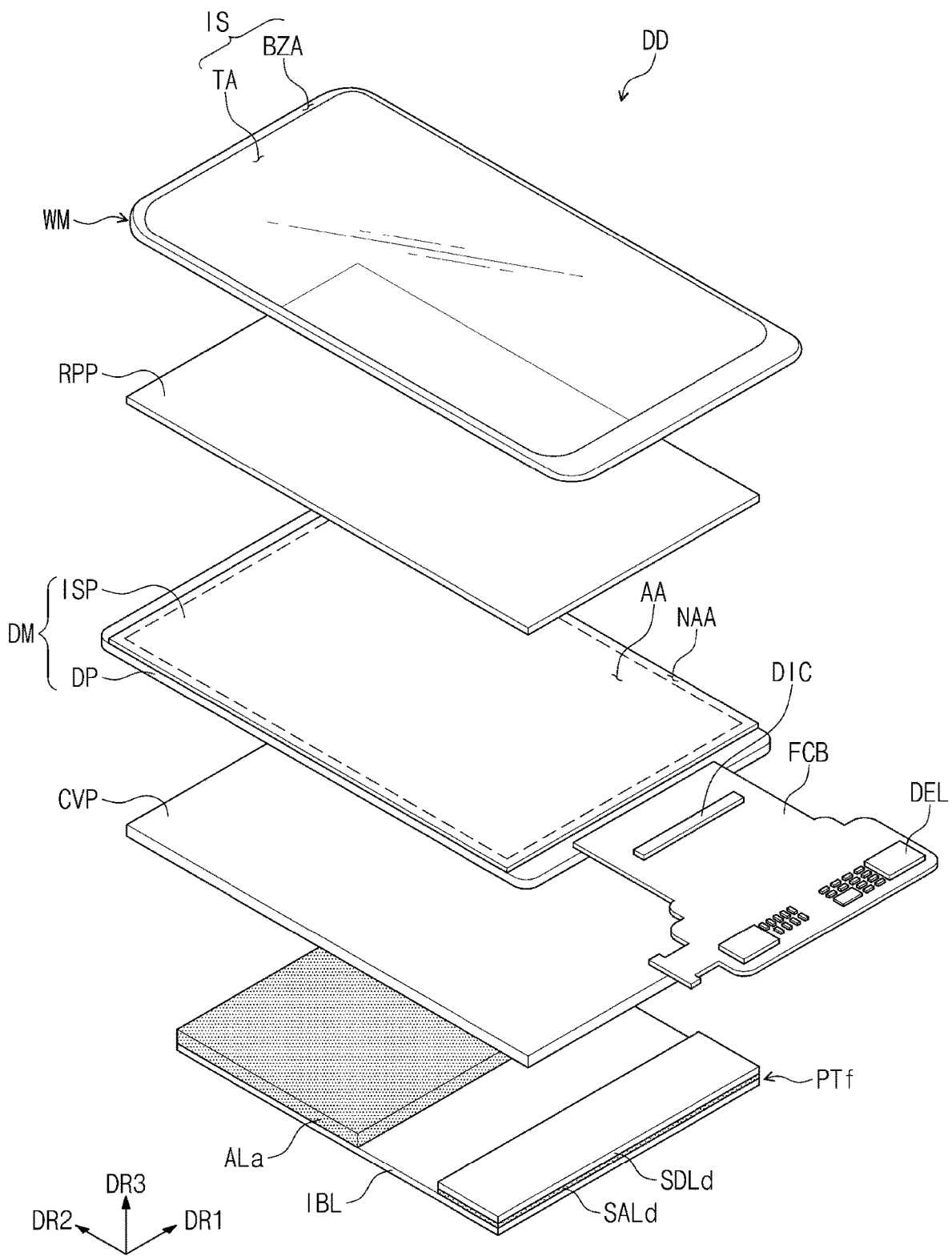
FIG. 13A is an exploded perspective view of a display device according to an embodiment.
Figure 13B:
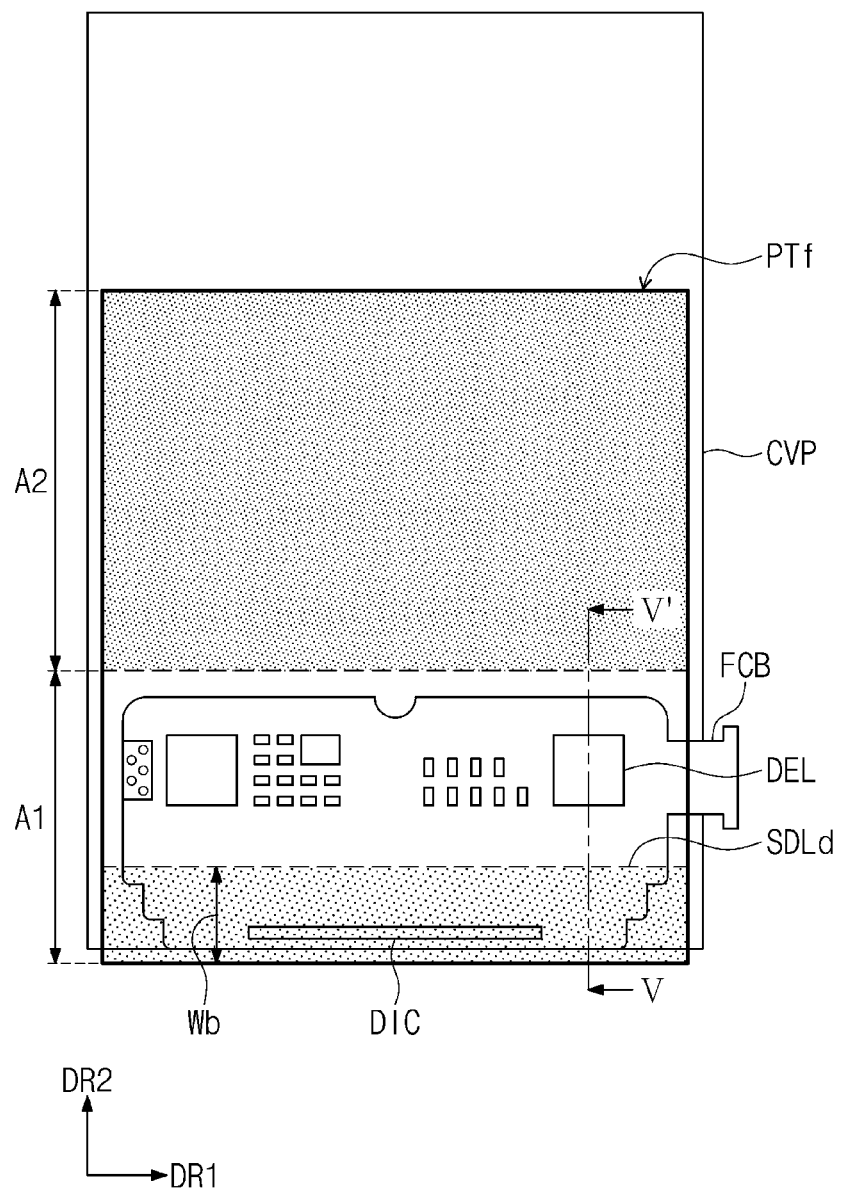
FIG. 13B is a rear view of the display device illustrated in FIG. 13A.
Figure 13C:
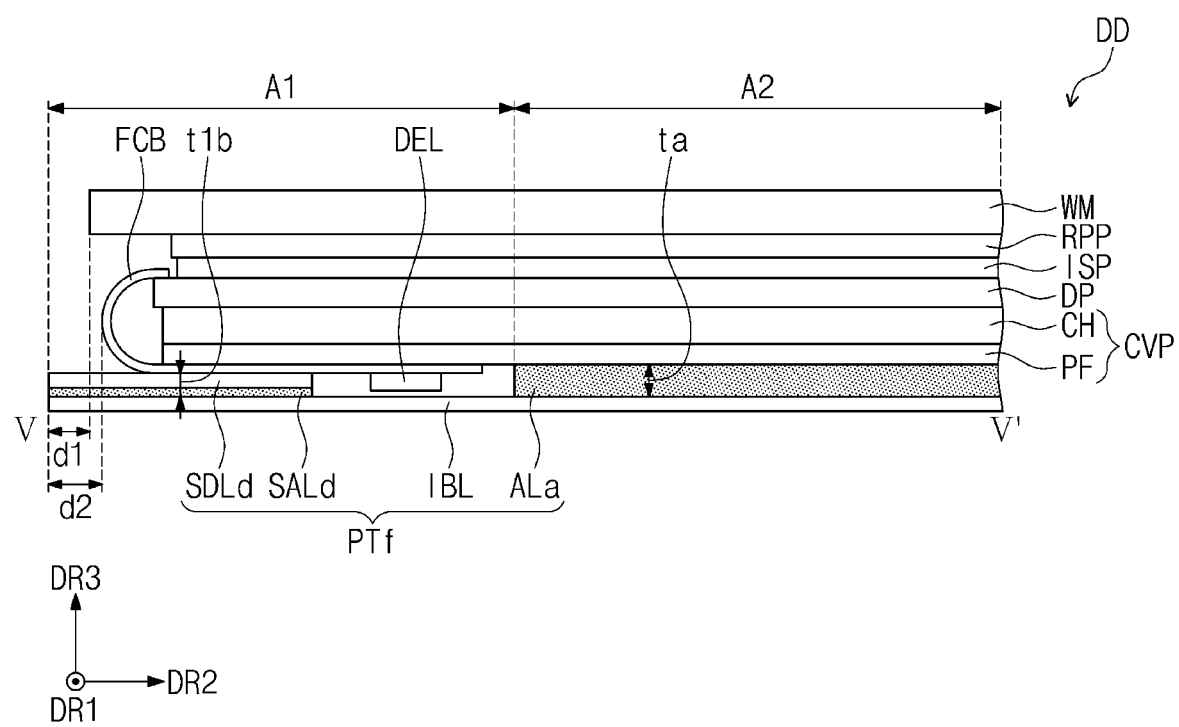
FIG. 13C is a sectional view taken along line V-V' in FIG. 13B.

FIG. 13A is an exploded perspective view of a display device according to an embodiment. FIG. 13B is a rear view of the display device illustrated in FIG. 13A. FIG. 13C is a sectional view taken along line V-V' in FIG. 13B. Among the components illustrated in FIGS. 13A to 13C, components identical to the components illustrated in FIGS. 1B, 4A, and 5 will be assigned with identical reference numerals, and specific descriptions thereabout will be omitted for ease in explanation of these figures.

Referring to FIGS. 13A to 13C, a protection tape PTf includes an insulating base layer IBL, an adhesive layer ALa, a step layer SDLd, and a sub-adhesive layer SALd. The insulating base layer IBL may include a first area A1 and a second area A2. Here, the first area A1 may be defined as an area overlapping a flexible circuit film FCB on the plane, and the second area A2 may be defined as an area not overlapping the flexible circuit film FCB on the plane.

The adhesive layer ALa is disposed on the insulating base layer IBL in the second area A2. Particularly, the adhesive layer ALa is disposed between the insulating base layer IBL and a cover panel CVP in the second area A2. The adhesive layer ALa is disposed so as not to overlap the flexible circuit film FCB on the plane.

The step layer SDLd is disposed over the insulating base layer IBL in the first area A1. The step layer SDLd may have a second width Wb in the second direction DR2. The second width Wb of the step layer SDLd may be greater than the first width Wa of the step layer SDL illustrated in FIG. 4B. In an embodiment, an end surface of the step layer SDLd and an end surface of the insulating base layer IBL may be disposed on the same line. However, the present disclosure is not limited thereto. Alternatively, the end surface of the step layer SDLd may be located inward of the end surface of the insulating base layer IBL.

As illustrated in FIG. 13B, the step layer SDLd may be provided in a position overlapping a driving chip DIC on the plane.

The sub-adhesive layer SALd is disposed between the step layer SDLd and the insulating base layer IBL. Accordingly, the step layer SDLd may be coupled to the upper surface of the insulating base layer IBL by the sub-adhesive layer SALd. The sum of the thickness of the step layer SDLd and the thickness of the sub-adhesive layer SALd (that is, the thickness t1b of the step) may be smaller than the thickness to of the adhesive layer ALa.

Figure 14A:
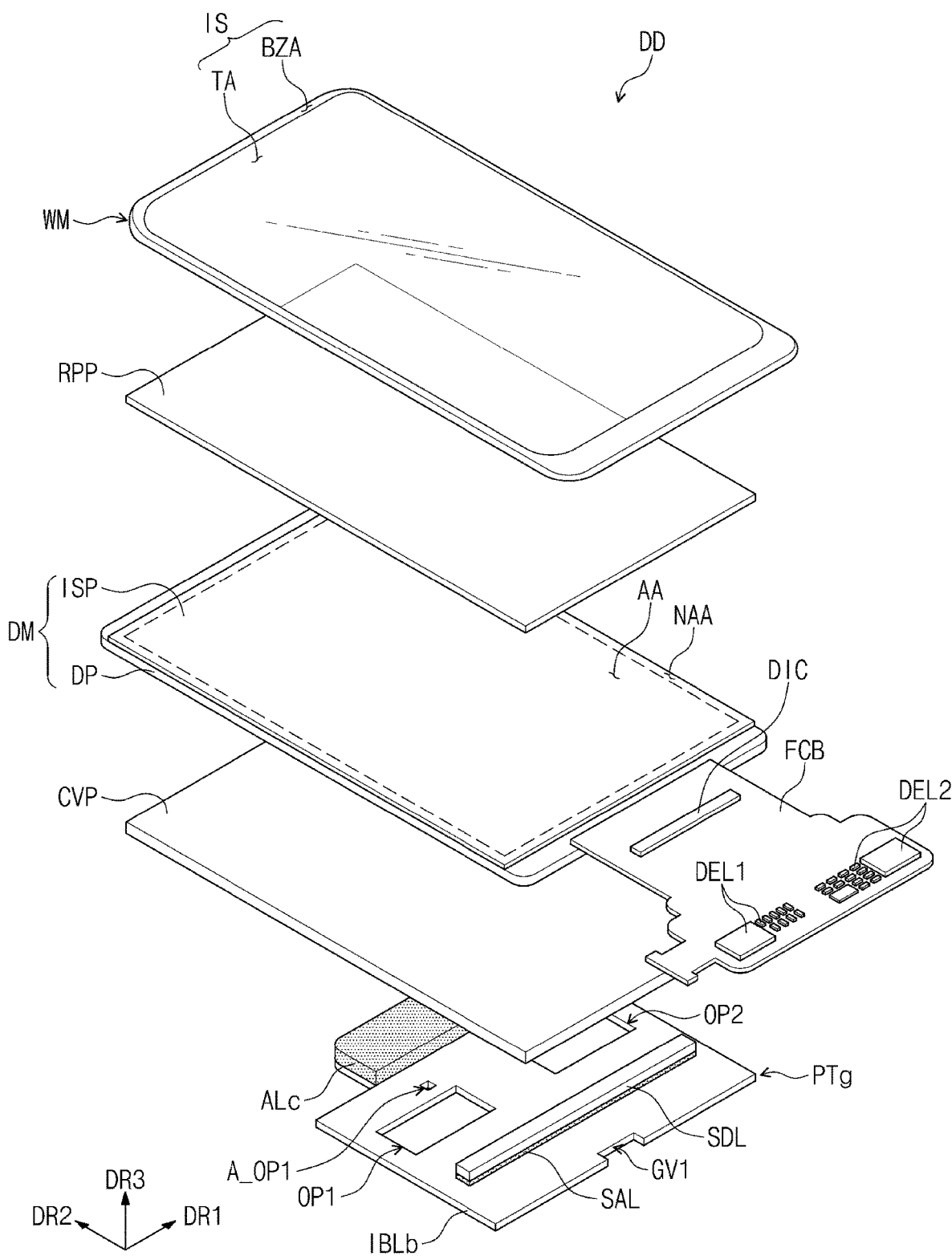
FIG. 14A is an exploded perspective view of a display device according to an embodiment.
Figure 14B:
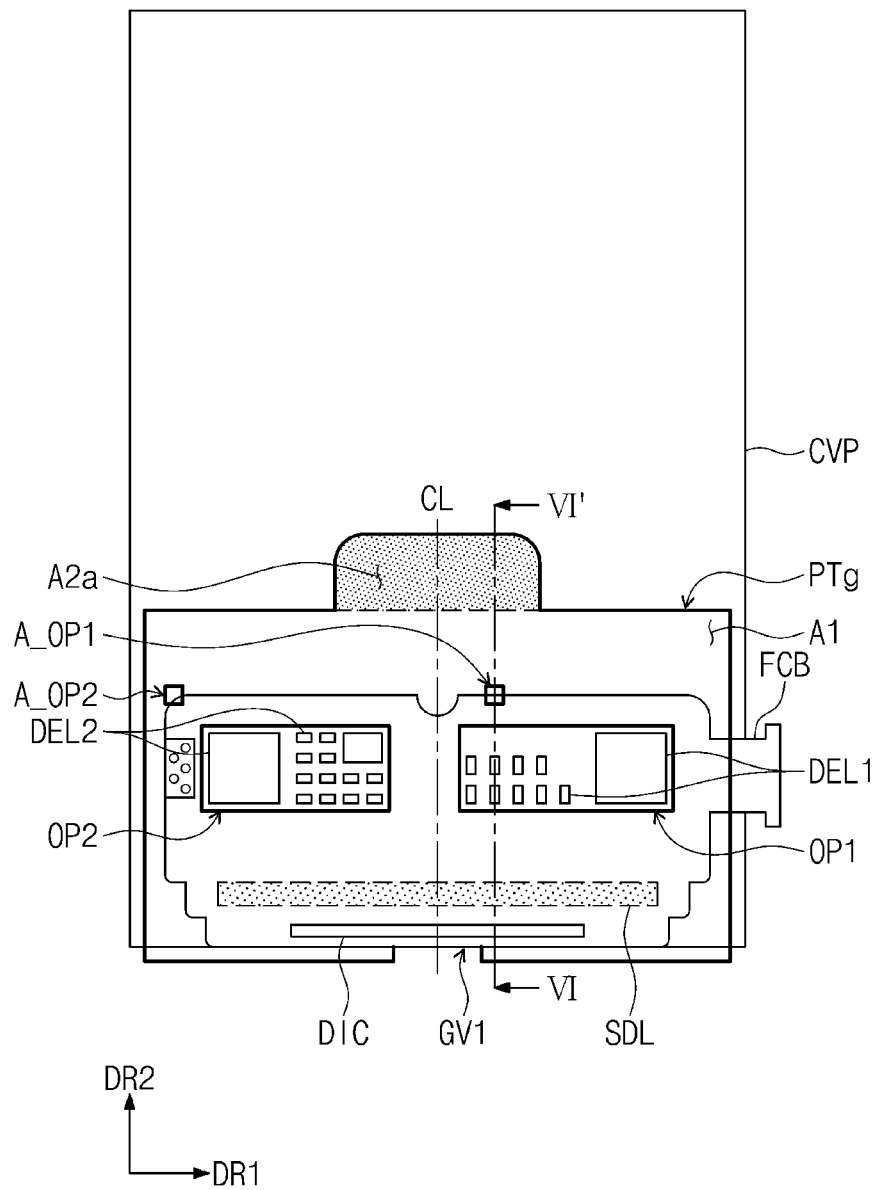
FIG. 14B is a rear view of the display device illustrated in FIG. 14A.
Figure 14C:
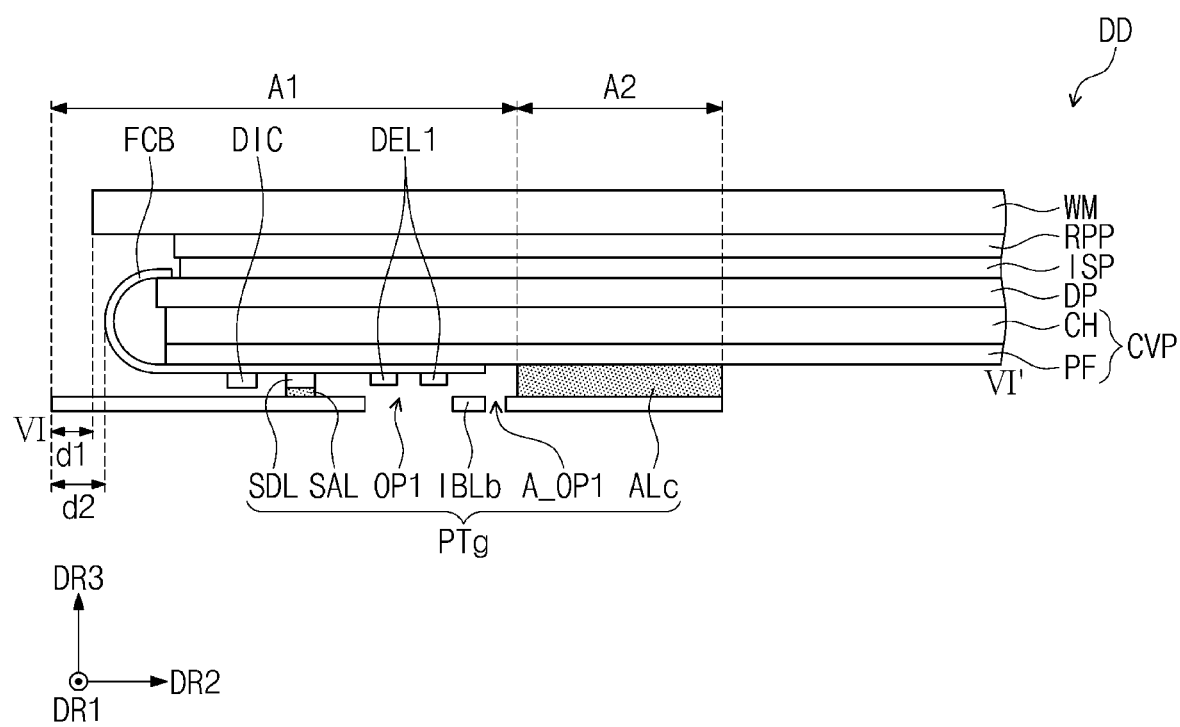
FIG. 14C is a sectional view taken along line VI-VI' in FIG. 14B.

FIG. 14A is an exploded perspective view of a display device according to an embodiment. FIG. 14B is a rear view of the display device illustrated in FIG. 14A. FIG. 14C is a sectional view taken along line VI-VI' in FIG. 14B. Among the components illustrated in FIGS. 14A to 14C, components identical to the components illustrated in FIGS. 12A to 12C will be assigned with identical reference numerals, and specific descriptions thereabout will be omitted for ease in explanation of these figures.

Referring to FIGS. 14A to 14C, a protection tape PTg includes an insulating base layer IBLb, an adhesive layer ALc, a step layer SDL, and a sub-adhesive layer SAL. The insulating base layer IBLb may include a first area A1 and a second area A2a. Here, the first area A1 may be defined as an area overlapping a flexible circuit film FCB on the plane, and the second area A2a may be defined as an area not overlapping the flexible circuit film FCB on the plane. In an embodiment, a center line CL of the flexible circuit film FCB that is parallel to the second direction DR2 may pass through the second area A2a.

The area of the second area A2a illustrated in FIG. 14B may be smaller than the area of the second area A2 illustrated in FIG. 4B. The position, area, and shape of the second area A2a may be variously modified in consideration of adhesive force or cost such that the second area A2a does not overlap the flexible circuit film FCB.

The protection tape PTg may further include a first groove GV1 concavely formed on an end surface of the insulating base layer IBLb. The first groove GV1 is formed for convenience of a process of attaching the protection tape PTg in the fabrication of the display device DD, but may be omitted in some implementations of this embodiment. The position and shape of the first groove GV1 and the number of first grooves GV1 may be variously modified without being limited thereto.

Figure 15A:
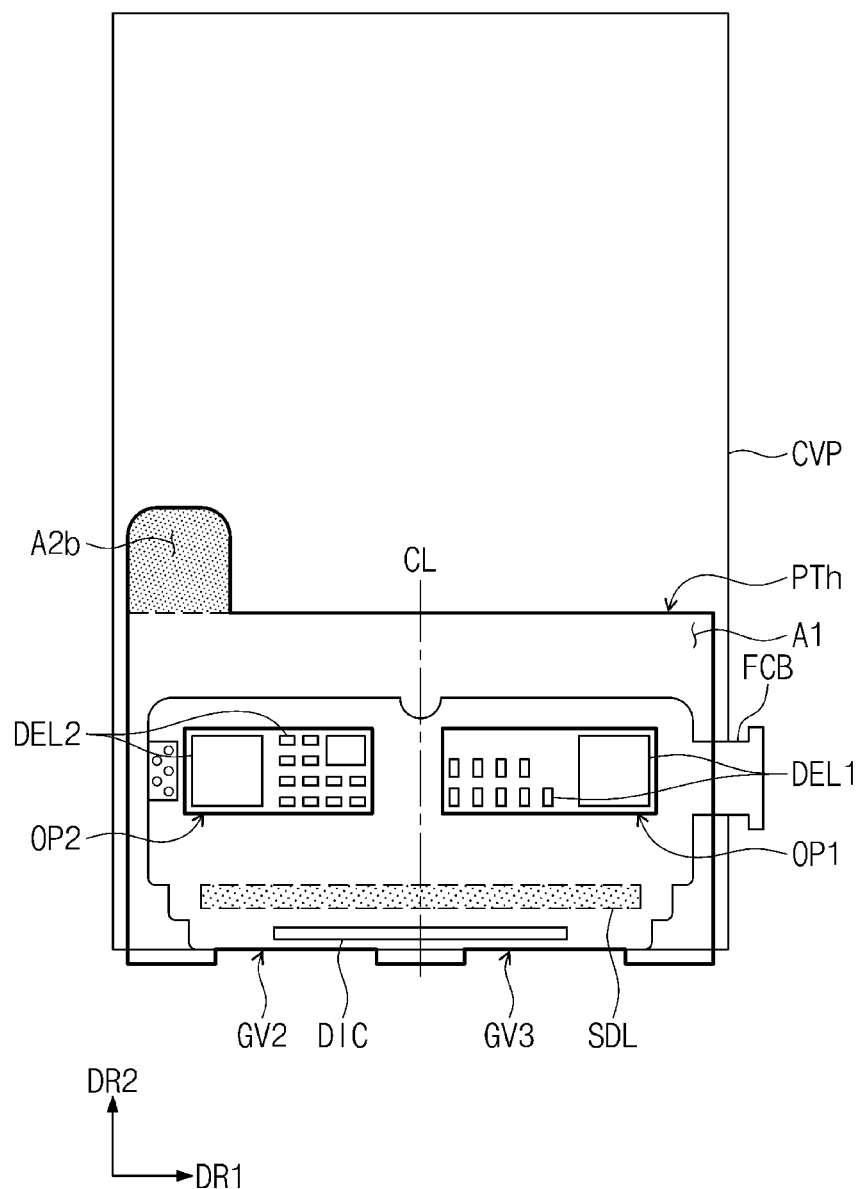
FIG. 15A is a rear view of a display device according to an embodiment.
Figure 15B:
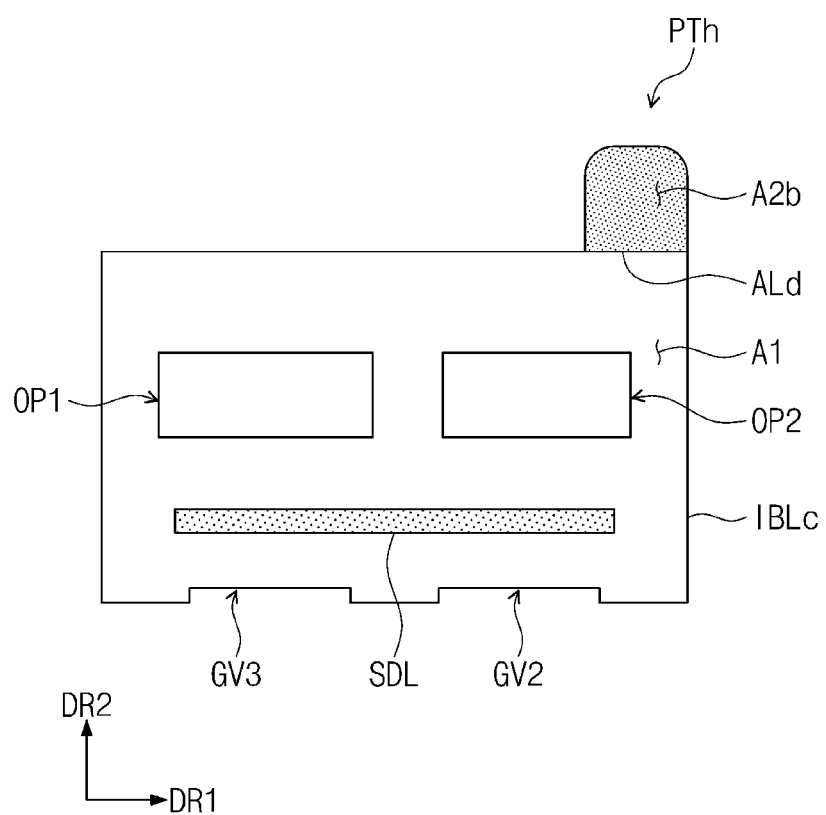
FIG. 15B is a plan view of a protection tape illustrated in FIG. 15A.

FIG. 15A is a rear view of a display device according to an embodiment, and FIG. 15B is a plan view of a protection tape illustrated in FIG. 15A. Among the components illustrated in FIGS. 15A and 15B, components identical to the components illustrated in FIGS. 14A to 14C will be assigned with identical reference numerals, and specific descriptions thereabout will be omitted for ease in explanation of these figures.

Referring to FIGS. 15A and 15B, the protection tape PTh includes an insulating base layer IBLc, an adhesive layer ALd, and a step layer SDL. The insulating base layer IBLc may include a first area A1 and a second area A2b. Here, the first area A1 may be defined as an area overlapping a flexible circuit film FCB on the plane, and the second area A2b may be defined as an area not overlapping the flexible circuit film FCB on the plane. In an embodiment, the second area A2b may be disposed on one side of a center line CL of the flexible circuit film FCB that is parallel to the second direction DR2.

The area of the second area A2b illustrated in FIG. 15B may be smaller than the area of the second area A2 illustrated in FIG. 4B. The position, area, and shape of the second area A2b may be variously modified in consideration of adhesive force or cost such that the second area A2b does not overlap the flexible circuit film FCB.

The protection tape PTh may further include a second groove GV2 and a third groove GV3 concavely formed on an end surface of the insulating base layer IBLc. The second and third grooves GV2 and GV3 are formed for convenience of a process of attaching the protection tape PTh in the fabrication of the display device DD, but may be omitted in some implementations of this embodiment. The positions, numbers, and shapes of second and third grooves GV2 and GV3 may be variously modified without being limited thereto.

Figure 16:
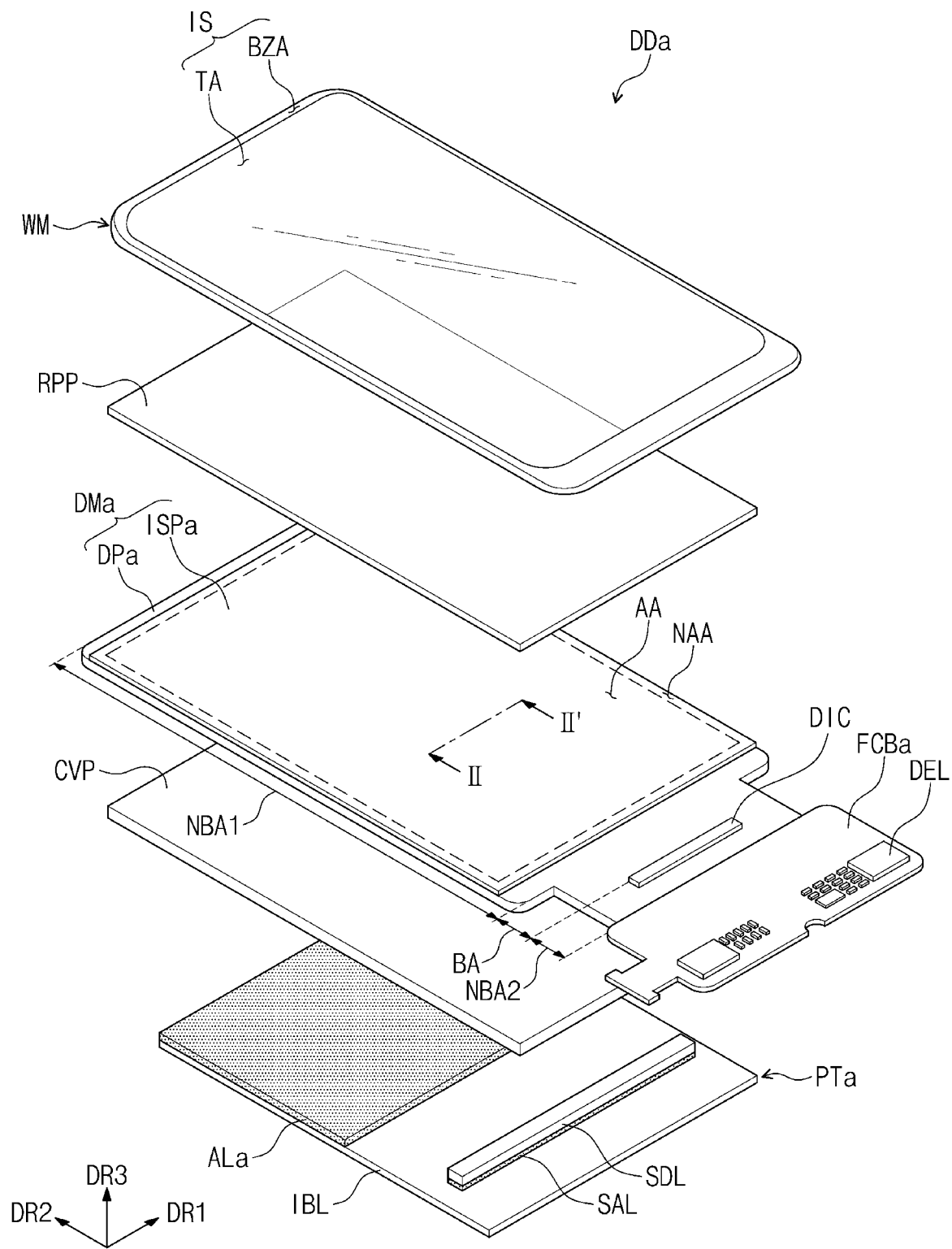
FIG. 16 is an exploded perspective view of a display device according to an embodiment.
Figure 17:
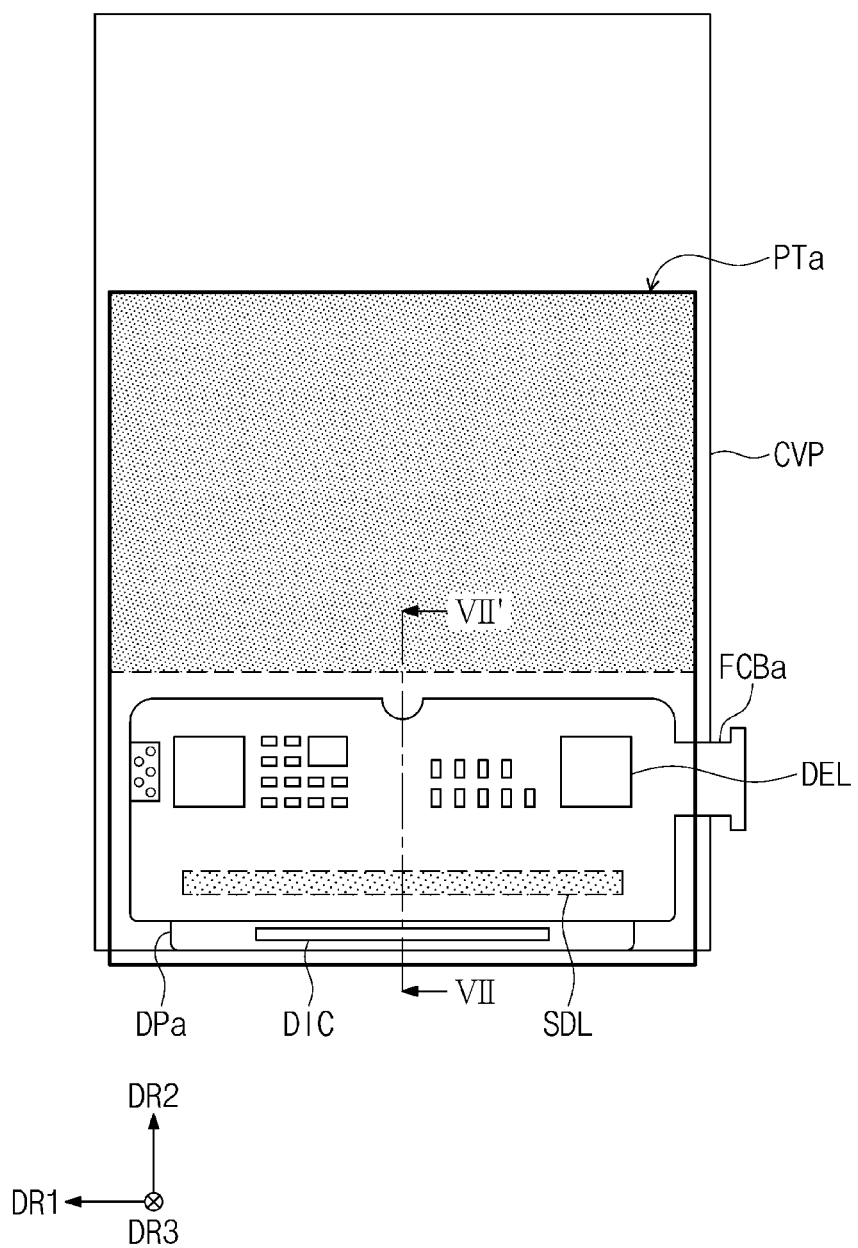
FIG. 17 is a rear view of the display device according to an embodiment.
Figure 18:
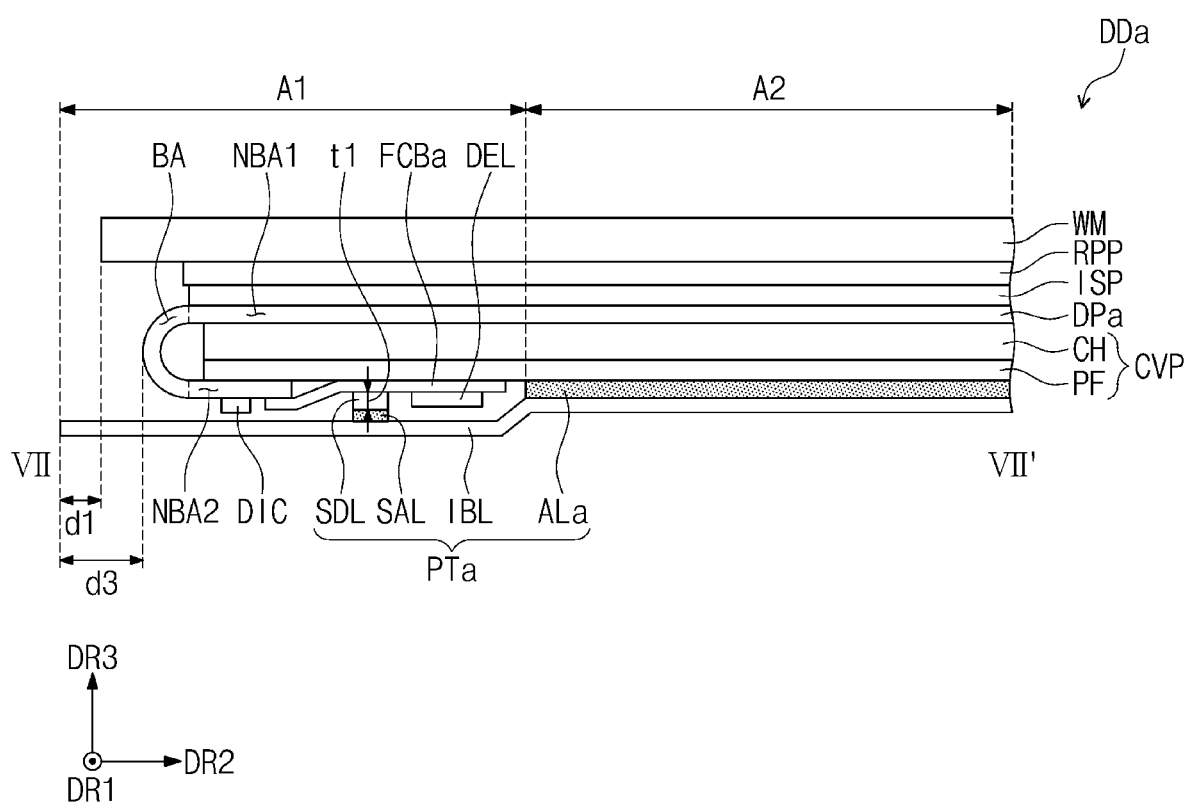
FIG. 18 is a sectional view taken along line VII-VII' illustrated in FIG. 17.

FIG. 16 is an exploded perspective view of a display device according to an embodiment. FIG. 17 is a rear view of the display device according to an embodiment. FIG. 18 is a sectional view taken along line VII-VII' in FIG. 17. Among the components illustrated in FIGS. 16 to 18, components identical to the components illustrated in FIGS. 1B and 4A to 5 will be assigned with identical reference numerals, and specific descriptions thereabout will be omitted for ease in explanation of these figures.

Referring to FIGS. 16 to 18, the display device DDa may include a window WM, a display module DMa, an anti-reflection film RPP, a cover panel CVP, and a protection tape PTa. The display module DMa may include a display panel DPa and an input sensing layer ISPa.

The display module DMa may be defined by an active area AA and a peripheral area NAA. The active area AA may be defined as an area that outputs an image provided by the display panel DPa. The peripheral area NAA is adjacent to the active area AA.

The display panel DPa may include a first non-bending area NBA1, a bending area BA, and a second non-bending area NBA2 arranged in the second direction DR2. The first non-bending area NBA1 may be an area corresponding to a display surface IS. The bending area BA and the second non-bending area NBA2 may be included in the peripheral area NAA. The bending area BA may be a bending area that is bent about a bending axis, and the first and second non-bending areas NBA1 and NBA2 may be areas that are not bent. In an embodiment, the bending axis may be parallel to the first direction DR1. The lengths of the bending area BA and the second non-bending area NBA2 in the first direction DR1 may be smaller than or equal to the length of the first non-bending area NBA1 in the first direction DR1. An area having a small length in the direction of the bending axis may be more easily bent.

The display panel DPa may be electrically connected with a flexible circuit film FCBa. The flexible circuit film FCBa may be coupled to the second non-bending area NBA2 of the display panel DPa through a bonding process. A driving chip DIC may be mounted on the second non-bending area NBA2 of the display panel DPa and may be electrically connected with the flexible circuit film FCBa. The flexible circuit film FCBa may be disposed under the rear side of the display panel DPa.

The display module DMa may further include a plurality of driving elements DEL mounted on the flexible circuit film FCBa. The plurality of driving elements DEL may include a circuit unit for converting a signal input from the outside into a signal required for the driving chip DIC or a signal required for driving the display panel DPa.

The cover panel CVP is disposed on the rear surface of the display panel DPa. The cover panel CVP, which is disposed on the rear surface of the display panel DPa, may improve the impact resistance of the display device DDa. The cover panel CVP may be fixed to the rear surface of the display panel DPa through an adhesive film.

The protection tape PTa is disposed under the display panel DPa. Specifically, the protection tape PTa may be disposed on the rear surface of the cover panel CVP and may cover the bending area BA and the second non-bending area NBA2 of the display panel DPa. The protection tape PTa may have a quadrilateral tape shape. However, the shape of the protection tape PTa is not limited thereto. The protection tape PTa may be implemented in various shapes having a size sufficient to cover the bending area BA and the second non-bending area NBA2 of the display panel DPa and the flexible circuit film FCBa.

The protection tape PTa includes an insulating base layer IBL, an adhesive layer ALa, and a step layer SDL. The insulating base layer IBL may contain an insulating material. The insulating base layer IBL may include a first area A1 and a second area A2. Here, the first area A1 may be defined as an area that overlaps the bending area BA and the second non-bending area NBA2 of the display panel DPa and the flexible circuit film FCBa on the plane, and the second area A2 may be defined as an area that does not overlap the bending area BA and the second non-bending area NBA2 of the display panel DPa and the flexible circuit film FCBa on the plane.

The adhesive layer ALa is disposed on the insulating base layer IBL in the second area A2. Particularly, the adhesive layer ALa is disposed between the insulating base layer IBL and the cover panel CVP in the second area A2. The adhesive layer ALa is disposed so as not to overlap the bending area BA and the second non-bending area NBA2 of the display panel DPa and the flexible circuit film FCBa on the plane.

The step layer SDL is disposed on the insulating base layer IBL in the first area A1. In an embodiment, the step layer SDL may be disposed to overlap the flexible circuit film FCBa on the plane and may not overlap the bending area BA and the second non-bending area NBA2 of the display panel DPa. The step layer SDL and the insulating base layer IBL are not integrally formed with each other. The protection tape PTa may further include a sub-adhesive layer SAL disposed between the step layer SDL and the insulating base layer IBL. The step layer SDL may be fixed to the insulating base layer IBL by the sub-adhesive layer SAL.

The sum of the thickness of the step layer SDL and the thickness of the sub-adhesive layer SAL (hereinafter, referred to as the thickness t1 of the step portion) may be greater than the thickness of a part having the greatest thickness among the driving chip DIC and the driving elements DEL. Accordingly, the upper surface of the step layer SDL may make contact with the upper surface of the flexible circuit film FCBa, but the driving chip DIC and the driving elements DEL may not make contact with the upper surface of the insulating base layer IBL. Thus, the driving chip DIC and the driving elements DEL may be prevented from being damaged by contact or friction with the protection tape PTa. In an embodiment, the thickness t1 of the step portion may range from about 1 mm to about 1.5 mm.

The thickness of the step layer SDL may be greater than or equal to the thickness of the insulating base layer IBL. When the driving chip DIC and the drive elements DEL are thick, the thickness of the step layer SDL or the sub-adhesive layer SAL may be adjusted to secure the thickness t1 of the step portion.

An end of the protection tape PTa may be located outward of an end of the window WM. The gap between the end of the protection tape PTa and the end of the window WM (hereinafter, referred to as the first gap d1) may range from 1 mm to 2 mm.

As the end of the protection tape PTa is located outward of the end of the window WM, the protection tape PTa may protect the bending area BA of the display panel DPa. The end of the window WM may be located outward of the bending area BA of the display panel DPa. When the gap between the end of the protection tape PTa and the bending area BA of the display panel DPa is defined as the third gap d3, the third gap d3 may be greater than the first gap d1.

As the gap d1 between the end of the protection tape PTa and the end of the window WM and the gap d3 between the end of the protection tape PTa and the bending area BA of the display panel DPa are ensured, the bending area BA of the display panel DPa may be stably protected in the process of transporting the display device DDa to fabricate the electronic device ED (refer to FIG. 1A).

The protection tape PTa may have a standardized shape irrespective of the shapes of the bending area BA and the second non-bending area NBA2 of the display panel DPa, the shape of the flexible circuit film FCBa, and the positions thereof. That is, the protection tape PTa may be commonly used for different types of display devices DDa. Accordingly, the time spent fabricating the protection tape PTa and the manufacturing cost may be reduced.

Figure 19:
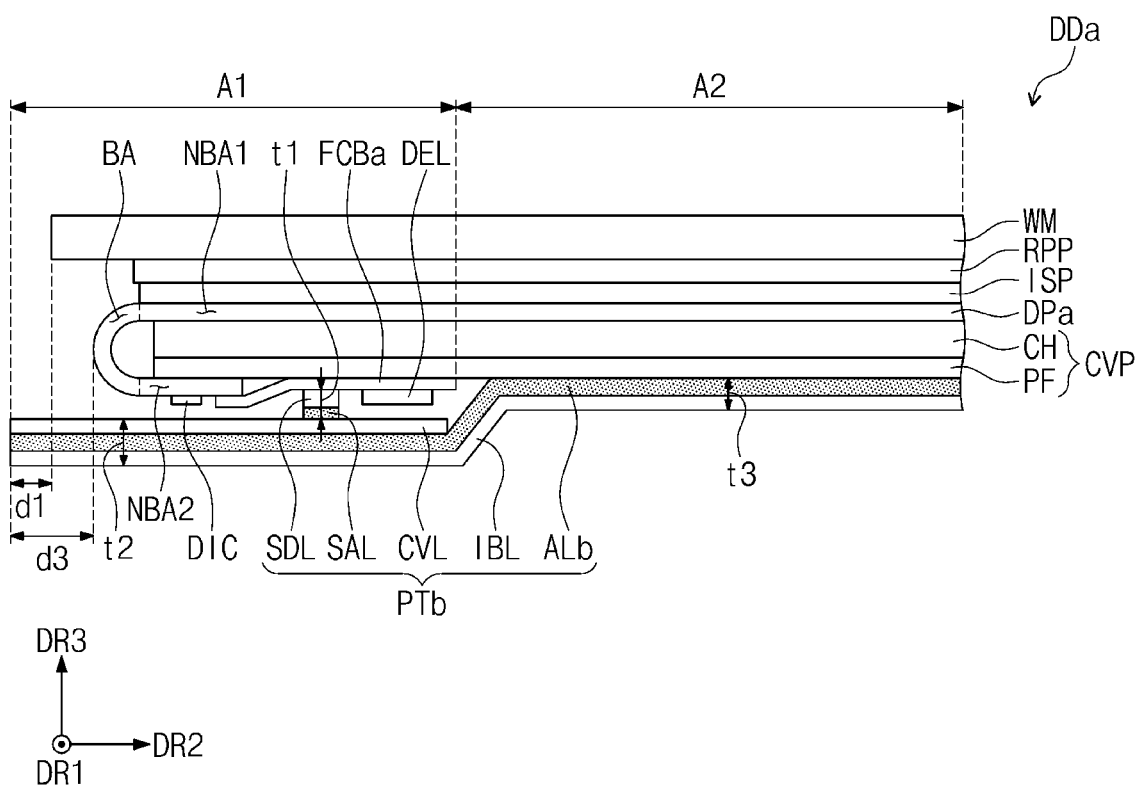
FIG. 19 is a sectional view of a display device according to an embodiment.

FIG. 19 is a sectional view of a display device according to an embodiment.

Referring to FIG. 19, a protection tape PTb includes an insulating base layer IBL, an adhesive layer ALb, a cover layer CVL, a step layer SDL, and a sub-adhesive layer SAL. The insulating base layer IBL may include a first area A1 and a second area A2. Here, the first area A1 may be defined as an area that overlaps a bending area BA and a second non-bending area NBA2 of a display panel DPa and a flexible circuit film FCBa on the plane. The second area A2 may be defined as an area that does not overlap the bending area BA and the second non-bending area NBA2 of the display panel DPa and the flexible circuit film FCBa on the plane.

The adhesive layer ALb is disposed on the insulating base layer IBL in the first and second areas A1 and A2. That is, the adhesive layer ALb is formed on the entire upper surface of the insulating base layer IBL. In this case, the adhesive layer ALb may be disposed to overlap the flexible circuit film FCBa on the plane.

The cover layer CVL is disposed on the adhesive layer ALb in the first area A1. The cover layer CVL may contain an insulating material.

The step layer SDL is disposed over the cover layer CVL. In an embodiment, the step layer SDL may be disposed in a position not overlapping a driving chip DIC and driving elements DEL on the plane. Accordingly, shocks may be prevented from being transmitted to the driving chip DIC and the driving elements DEL through the step layer SDL to cause damage to the driving chip DIC and the driving elements DEL.

The step layer SDL and the cover layer CVL are not integrally formed with each other. That is, the sub-adhesive layer SAL is disposed between the step layer SDL and the cover layer CVL.

The sum of the thickness of the step layer SDL and the thickness of the sub-adhesive layer SAL (hereinafter, referred to as the thickness t1 of the step portion) may be greater than the thickness of a part having the greatest thickness among the driving chip DIC and the driving elements DEL. Accordingly, the upper surface of the step layer SDL may make contact with the upper surface of the flexible circuit film FCBa, but the driving chip DIC and the driving elements DEL may not make contact with the upper surface of the insulating base layer IBL. Thus, the driving chip IC DIC and the driving elements DEL may be prevented from being damaged by contact or friction with the protection tape PTb. In an embodiment, the thickness t1 of the step portion may range from about 1 mm to about 1.5 mm.

The thickness of the step layer SDL may be greater than or equal to the thickness of the insulating base layer IBL or the cover layer CVL. When the driving chip DIC and the driving elements DEL are thick, the thickness of the step layer SDL or the sub-adhesive layer SAL may be adjusted to secure the thickness t1 of the step portion.

An end of the protection tape PTb may be located outward of an end of a window WM. The gap between the end of the protection tape PTb and the end of the window WM (hereinafter, referred to as the first gap d1) may range from 1 mm to 2 mm.

As the end of the protection tape PTb is located outward of the end of the window WM, the protection tape PTb may protect the bending area BA of the display panel DPa. The end of the window WM may be located outward of the bending area BA of the display panel DPa. When the gap between the end of the protection tape PTb and the bending area BA of the display panel DPa is defined as the third gap d3, the third gap d3 may be greater than the first gap d1.

The thickness t2 of the protection tape PTb in the first area A1 may be greater than the thickness t3 of the protection tape PTb in the second area A2.

Figure 20:
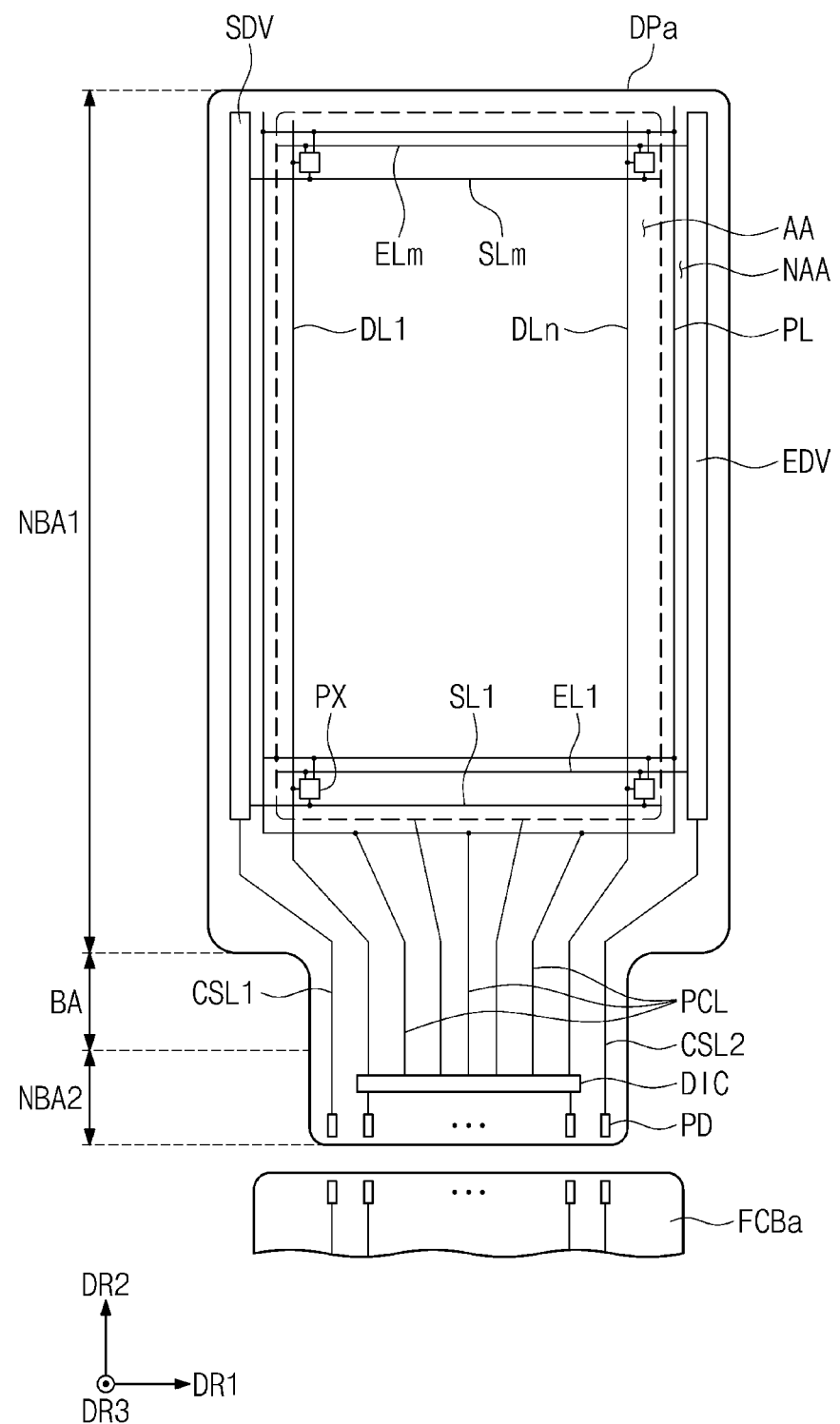
FIG. 20 is a plan view of a display panel according to an embodiment.

FIG. 20 is a plan view of a display panel according to an embodiment.

Referring to FIG. 20, the display panel DPa according to the embodiment may be divided into a first non-bending area NBA1, a bending area BA, and a second non-bending area NBA2. The first non-bending area NBA1, the bending area BA, and the second non-bending area NBA2 of the display panel DPa illustrated in FIG. 20 correspond to the first non-bending area NBA1, the bending area BA, and the second non-bending area NBA2 of the display module DMa described above with reference to FIG. 16. The expression "an area/portion corresponds to another area/portion" used herein denotes that the areas/portions overlap each other and is not limited to having the same area.

The display panel DPa according to an embodiment may include an active area AA where pixels PX are disposed and a peripheral area NAA adjacent to the active area AA. The active area AA and the peripheral area NAA correspond to the active area AA and the peripheral area NAA described above with reference to FIG. 16. The active area AA corresponds to the area where the pixels PX are disposed in the first non-bending area NBA1, and the peripheral area NAA includes the bending area BA, the second non-bending area NBA2, and the rest of the first non-bending area NBA1 other than the area where the pixels PX are disposed.

The display panel DPa may include a scan driver SDV, an emission driver EDV, and a driving chip DIC on the peripheral area NAA. The driving chip DIC may be a data driver.

The display panel DPa may include the plurality of pixels PX, a plurality of scan lines SL1 to SLm, a plurality of data lines DL1 to DLn, a plurality of emission lines EL1 to ELm, a first control line CSL1, a second control line CSL2, a power line PL, and a plurality of pads PD. Here, "m" and "n" are natural numbers. The pixels PX may be connected to the scan lines SL1 to SLm, the data lines DL1 to DLn, and the emission lines EL1 to ELm.

The scan lines SL1 to SLm may extend in the first direction DR1 and may be connected to the scan driver SDV. The data lines DL1 to DLn may extend in the second direction DR2 and may be disposed from the first non-bending area NBA1 through the bending area BA to the second non-bending area NBA2. The data lines DL1 to DLn may be connected to the driving chip DIC in the second non-bending area NBA2. The emission lines EL1 to ELm may extend in the first direction DR1 and may be connected to the emission driver EDV.

The power line PL may include a portion extending in the first direction DR1 and a portion extending in the second portion DR2. The portion extending in the first direction DR1 and the portion extending in the second portion DR2 may be disposed on different layers. The power line PL may provide a reference voltage to the pixels PL.

The display panel DPa may further include a power connection line PCL connecting the power line PL and the driving chip DIC. The power connection line PCL may extend from the first non-bending area NBA1 through the bending area BA to the second non-bending area NBA2. The power connection line PCL may be disposed between the data lines DL1 to DLn in the bending area BA and the second non-bending area NBA2. Although three power connection lines PCL are illustrated as being disposed between the data lines DL1 to DLn arranged in the first direction DR1, the number and positions of power connection lines PCL are not limited thereto.

The first control line CSL1 may be connected to the scan driver SDV and may extend from the first non-bending area NBA1 through the bending area BA to the second non-bending area NBA2. The second control line CSL2 may be connected to the emission driver EDV and may extend from the first non-bending area NBA1 through the bending area BA to the second non-bending area NBA2. The first control line CSL1 may be disposed adjacent to the first data line DL1 among the data lines DL1 to DLn, and the second control line CSL2 may be disposed adjacent to the n-th data line DLn among the data lines DL1 to DLn.

The pads PD may be disposed adjacent to an end of the second non-bending area NBA2. The driving chip DIC, the power line PL, the first control line CSL1, and the second control line CSL2 may be connected to the pads PD. A flexible circuit film FCBa may overlap the end of the second non-bending area NBA2 of the display panel DPa and may be disposed on the display panel DPa. The flexible circuit film FCBa may include pads corresponding to the pads PD and may be electrically connected to the pads PD through an anisotropic conductive adhesive layer.

Sensing connection wires connected with an input sensing layer ISPa may be additionally disposed in the bending area BA and the second non-bending area NBA2. In the bending area BA, the sensing connection wires may be disposed between the data lines DL1 to DLn.

Figure 21:
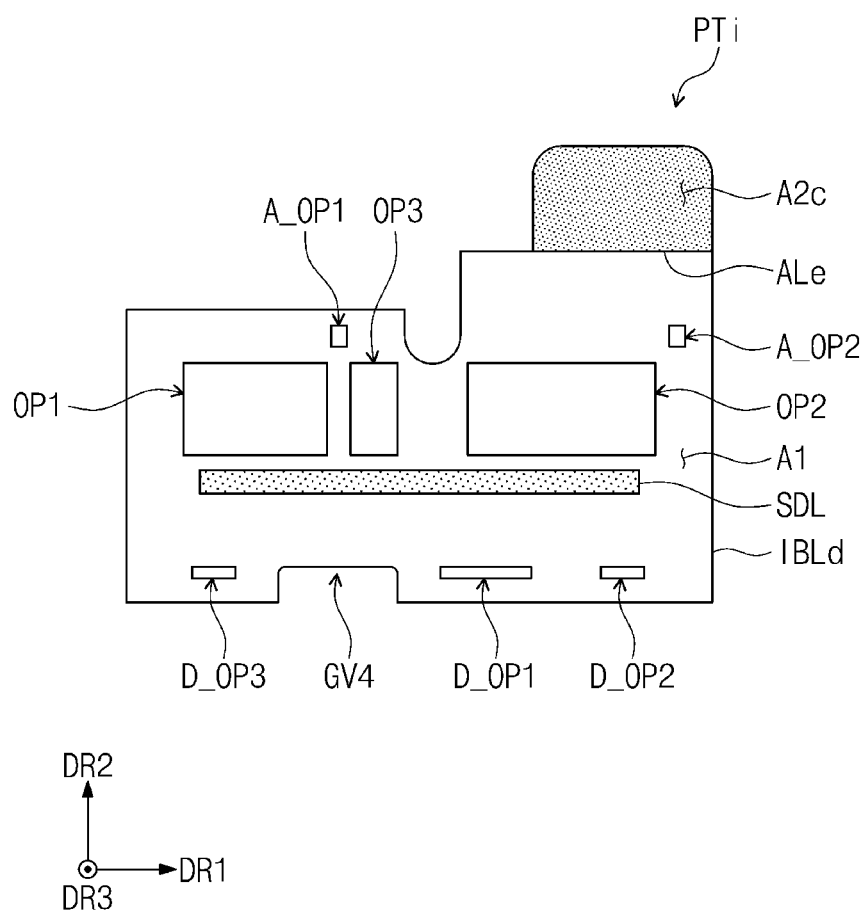
FIG. 21 is a plan view of a protection tape according to an embodiment.
Figure 22:
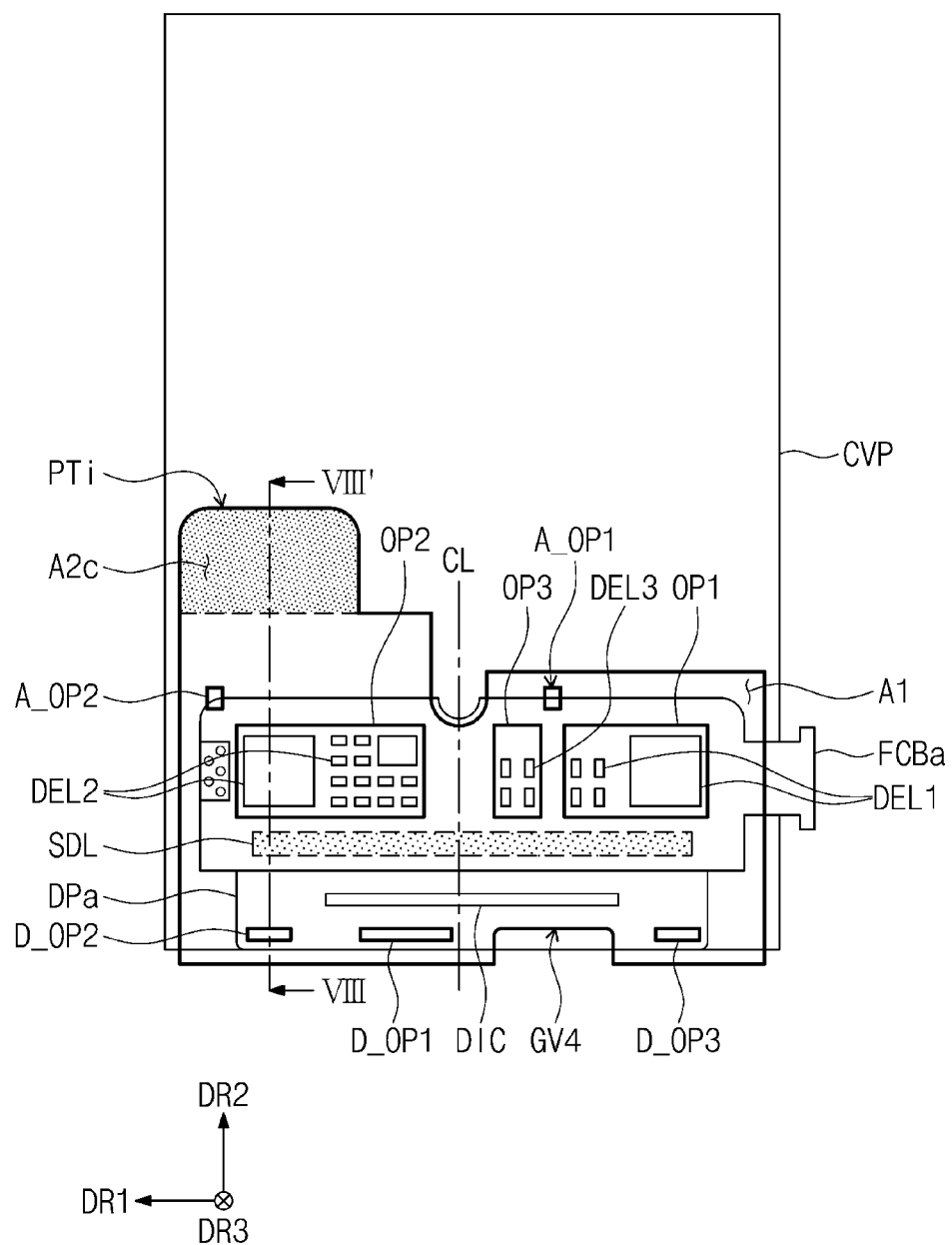
FIG. 22 is a rear view of a display device employing the protection tape illustrated in FIG. 21.
Figure 23:
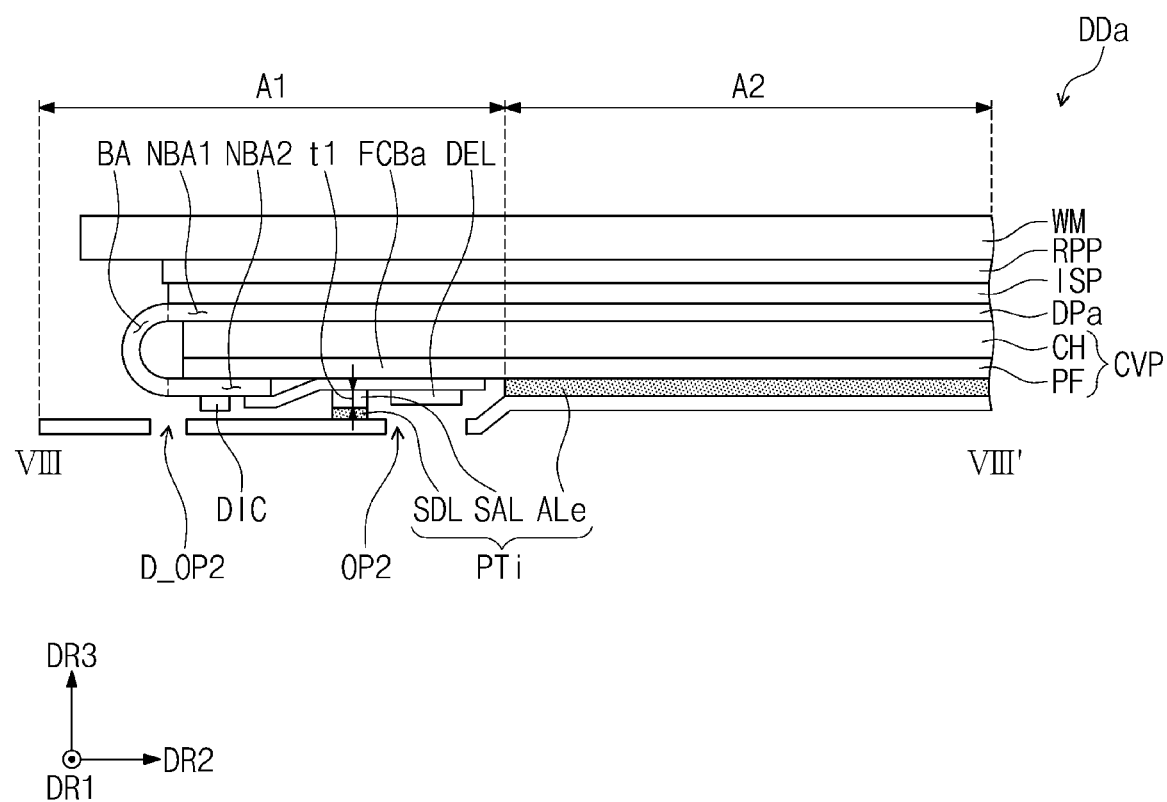
FIG. 23 is a sectional view taken along line VIII-VIII' in FIG. 22.

FIG. 21 is a plan view of a protection tape according to an embodiment. FIG. 22 is a rear view of a display device employing the protection tape illustrated in FIG. 21. FIG. 23 is a sectional view taken along line VIII-VIII' in FIG. 22.

Referring to FIGS. 21 and 22, the protection tape PTi includes an insulating base layer IBLd, an adhesive layer ALe, and a step layer SDL. The insulating base layer IBLd may include a first area A1 and a second area A2c. Here, the first area A1 may be defined as an area that overlaps a bending area BA and a second non-bending area NBA2 of a display panel DPa and a flexible circuit film FCBa on the plane. The second area A2c may be defined as an area that does not overlap the bending area BA and the second non-bending area NBA2 of the display panel DPa and the flexible circuit film FCBa on the plane.

The area of the second area A2c illustrated in FIG. 21 may be smaller than the area of the second area A2 illustrated in FIG. 17. The position, area, and shape of the second area A2c may be variously modified in consideration of adhesive force or cost such that the second area A2c does not overlap the flexible circuit film FCBa.

The insulating base layer IBLd may include a first opening OP1, a second opening OP2, and a third opening OP3 formed in the first area A1. The flexible circuit film FCBa may include first driving elements DEL1 disposed on a first side (e.g., the right side) and second driving elements DEL2 disposed on a second side (e.g., the left side) with respect to a center line CL of the flexible circuit film FCBa that is parallel to the second direction DR2. The flexible circuit film FCBa may further include third driving elements DEL3 disposed between the center line CL and the first driving elements DEL1.

The first opening OP1 is formed through the insulating base layer IBLd in a position corresponding to the first driving elements DEL1. The second opening OP2 is formed through the insulating base layer IBLd in a position corresponding to the second driving elements DEL2. The third opening OP3 is formed through the insulating base layer IBLd in a position corresponding to the third driving elements DEL3.

Accordingly, when the protection tape PTi is coupled to the flexible circuit film FCBa and the rear surface of a cover panel CVP, the first driving elements DEL1 may be exposed through the first opening OP1 of the insulating base layer IBLd, and the second driving elements DEL2 may be exposed through the second opening OP2 of the insulating base layer IBLd. The third driving elements DEL3 may be exposed through the third opening OP3 of the insulating base layer IBLd.

Although FIGS. 21 and 22 illustrate the structure in which the three openings OP1, OP2, and OP3 are formed in the insulating base layer IBLd, the present disclosure is not limited thereto. For example, the first, second, and third openings OP1, OP2, and OP3 may be connected together to form one opening. Furthermore, the positions, shapes, and numbers of first to third openings OP1 to OP3 may be adjusted depending on the arrangement of the first, second, and third driving elements DEL1, DEL2, and DEL3.

The insulating base layer IBLd may further include first and second alignment openings A_OP1 and A_OP2 formed in the first area A1. The first alignment hole A_OP1 may be disposed on the first side with respect to the center line CL, and the second alignment hole A_OP2 may be disposed on the second side with respect to the center line CL.

As the flexible circuit film FCBa disposed under the protection tape PTi is visible through the first and second alignment holes A_OP1 and A_OP2, the protection tape PTi may be easily aligned with the flexible circuit film FCBa when coupled to the cover panel CVP. Accordingly, misalignment between the protection tape PTi and the flexible circuit film FCBa may be prevented in the process of coupling the protection tape PTi to the cover panel CVP. Alignment marks may be additionally provided on the flexible circuit film FCBa to correspond to the first and second alignment holes A_OP1 and A_OP2.

The protection tape PTi further includes a first data opening D_OP1, a second data opening D_OP2, and a third data opening D_OP3, each of which overlaps some of the data lines DL1 to DLn disposed on the second non-bending area NBA2 of the display panel DPa. The first to third data openings D_OP1 to D_OP3 are formed through the insulating base layer IBLd. The first to third data openings D_OP1 to D_OP3 may be provided to prevent a problem in which the protection tape PTi presses the data lines DL1 to DLn disposed on the second non-bending area NBA2 of the display panel DPa and due to the impact, there are cracks in the data lines DL1 to DLn. That is, the protection tape PTi may be partially open in positions overlapping the data lines DL1 to DLn, and thus application of an impact to the data lines DL1 to DLn due to contact with the protection tape PTi may be prevented.

The numbers and positions of first to third data openings D_OP1 to D_OP3 are not limited thereto and may be varied depending on the arrangement of the data lines DL1 to DLn.

The protection tape PTi may further include a fourth groove GV4 concavely formed on an end surface of the insulating base layer IBLd. The fourth groove GV4 is formed for convenience of a process of attaching the protection tape PTi in the fabrication of the display device DDa, but may be omitted in some implementations of this embodiment. In an embodiment, the fourth groove GV4 may overlap some of the data lines DL1 to DLn disposed on the second non-bending area NBA2 of the display panel DPa. Accordingly, the fourth groove GV4 may prevent an impact from being applied to the data lines DL1 to DLn due to contact with the protection tape PTi. The position and shape of the fourth groove GV4 and the number of fourth grooves GV4 may be variously modified without being limited thereto.

Figure 24:
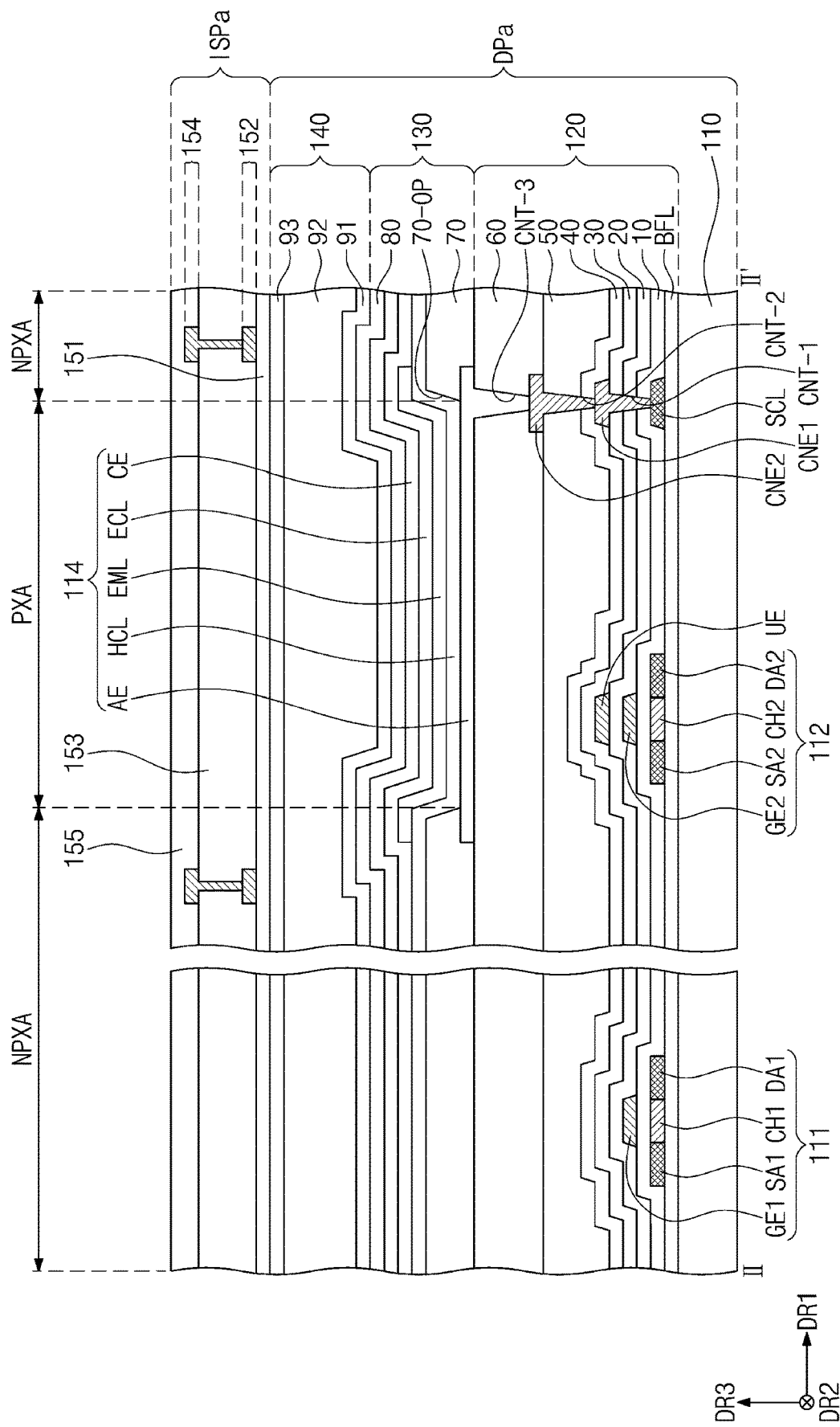
FIG. 24 is a sectional view of a display panel and an input sensing layer taken along line II-IF in FIG. 16.

FIG. 24 is a sectional view of the display panel and the input sensing layer taken along line II-IF in FIG. 16.

Referring to FIG. 24, the display panel DPa may include a plurality of insulating layers, semiconductor patterns, conductive patterns, signal lines, and the like. An insulating layer, a semiconductor layer, and a conductive layer are formed by coating, deposition, or the like. Thereafter, the insulating layer, the semiconductor layer, and the conductive layer may be selectively subjected to patterning by photolithography. Semiconductor patterns, conductive patterns, signal lines, and the like that are included in a circuit element layer 120 and a display element layer 130 are formed on a base layer 110 by the above-described method. An encapsulation layer 140 for covering the display element layer 130 may be formed.

The base layer 110 may include a synthetic resin film. The synthetic resin layer may contain a thermosetting resin. The base layer 110 may have a multi-layer structure. For example, the base layer 110 may have a three-layer structure including a synthetic resin layer, an adhesive layer, and a synthetic resin layer. In particular, the synthetic resin layers may be polyimide-based resin layers, and the materials thereof are not particularly limited. The synthetic resin layers may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the base layer 110 may include a glass substrate, an organic/inorganic composite substrate, or the like.

At least one inorganic layer is formed on the upper surface of the base layer 110. The inorganic layer may contain at least one of aluminum oxide, titanium oxide, silicon oxide, silicon oxynitride, zirconium oxide, or hafnium oxide. The inorganic layer may include multiple layers. The multiple inorganic layers may constitute a barrier layer and/or a buffer layer. In this embodiment, the display panel DPa is illustrated as including a buffer layer BFL.

The buffer layer BFL may improve a bonding force between the base layer 110 and the semiconductor patterns. The buffer layer BFL may include silicon oxide layers and silicon nitride layers. The silicon oxide layers and the silicon nitride layers may be alternately stacked one above another.

The semiconductor patterns are disposed on the buffer layer BFL. The semiconductor patterns may contain polysilicon. However, without being limited thereto, the semiconductor patterns may contain amorphous silicon or oxide semiconductor.

As illustrated in FIG. 24, a first semiconductor pattern of a first transistor 111 and a second semiconductor pattern of a second transistor 112 are disposed on the buffer layer BFL. The first semiconductor pattern includes a first source SA1, a first channel CH1, and a first drain DA1, and the second semiconductor pattern includes a second source SA2, a second channel CH2, and a second drain DA2. The first channel CH1 is disposed between the first source SA1 and the first drain DA1, and the second channel CH2 is disposed between the second source SA2 and the second drain DA2. A portion of a connecting signal line SCL that is one of the signal lines SGL (illustrated in FIG. 2) is illustrated in FIG. 24. Although not separately illustrated, the connecting signal line SCL may be connected to the second drain DA2 of the second transistor 112 on the plane.

A first insulating layer 10 is disposed on the buffer layer BFL. The first insulating layer 10 covers a plurality of semiconductor patterns. The first insulating layer 10 may be an inorganic layer and/or an organic layer and may have a single layer structure or a multi-layer structure. The first insulating layer 10 may contain at least one of aluminum oxide, titanium oxide, silicon oxide, silicon oxynitride, zirconium oxide, or hafnium oxide. In this embodiment, the first insulating layer 10 may be a single layer of silicon oxide. Not only the first insulating layer 10 but also insulating layers of the circuit element layer 120, which will be described below, may be inorganic layers and/or organic layers and may have a single layer structure or a multi-layer structure. The inorganic layers may contain at least one of the aforementioned materials.

A first gate GE1 of the first transistor 111 and a second gate GE2 of the second transistor 112 are disposed on the first insulating layer 10. The first and second gates GE1 and GE2 overlap the first and second channels CH1 and CH2, respectively.

A second insulating layer 20 may be disposed on the first insulating layer 10 and may cover the first and second gates GE1 and GE2. The second insulating layer 20 may be an inorganic layer and/or an organic layer and may have a single layer structure or a multi-layer structure. In this embodiment, the second insulating layer 20 may be a single layer of silicon oxide.

An upper electrode UE may be disposed on the second insulating layer 20. The upper electrode UE may overlap the second gate GE2 of the second transistor 112. A portion of the second gate GE2 and the upper electrode UE overlapping the second gate GE2 may form a capacitor.

A third insulating layer 30 may be disposed on the second insulating layer 20 and may cover the upper electrode UE. In this embodiment, the third insulating layer 30 may be a single layer of silicon oxide. A first connecting electrode CNE1 may be disposed on the third insulating layer 30. The first connecting electrode CNE1 may be connected to the connecting signal line SCL through a first contact hole CNT-1 formed through the first, second, and third insulating layers 10, 20, and 30.

A fourth insulating layer 40 may be disposed on the third insulating layer 30. The fourth insulating layer 40 may be a signal layer of silicon oxide. A fifth insulating layer 50 may be disposed on the fourth insulating layer 40. The fifth insulating layer 50 may be an organic layer. A second connecting electrode CNE2 may be disposed on the fifth insulating layer 50. The second connecting electrode CNE2 may be connected to the first connecting electrode CNE1 through a second contact hole CNT-2 formed through the fourth insulating layer 40 and the fifth insulating layer 50.

A sixth insulating layer 60 may be disposed on the fifth insulating layer 50 and may cover the second connecting electrode CNE2. The sixth insulating layer 60 may be an organic layer. A first electrode AE is disposed on the sixth insulating layer 60. The first electrode AE is connected to the second connecting electrode CNE2 through a third contact hole CNT-3 formed through the sixth insulating layer 60. An opening 70-OP is defined in a pixel defining film 70. The opening 70-OP of the pixel defining film 70 exposes at least part of the first electrode AE.

The active area AA (refer to FIG. 1B) may include emissive areas PXA and a non-emissive area NPXA adjacent to the emissive areas PXA. The non-emissive area NPXA may surround the emissive areas PXA. In this embodiment, each of the emissive areas PXA is defined to correspond to a partial area of the first electrode AE exposed through the opening 70-OP.

A hole control layer HCL may be commonly disposed in the emissive areas PXA and the non-emissive area NPXA. The hole control layer HCL may include a hole transporting layer and may further include a hole injection layer. An emissive layer EML may be disposed on the hole control layer HCL. The emissive layer EML may be disposed in an area corresponding to the opening 70-OP. That is, the emissive layer EML may be separately formed in each of the emissive areas PXA.

An electron control layer ECL may be disposed on the emissive layer EML. The electron control layer ECL may include an electron transporting layer and may further include an electron injection layer. The hole control layer HCL and the electron control layer ECL may be commonly formed in the emissive areas PXA by using an open mask. A second electrode CE may be disposed on the electron control layer ECL. The second electrode CE has an integrated shape and is commonly disposed in the emissive areas PXA.

A capping layer 80 may be disposed on the second electrode CE and may be brought into contact with the second electrode CE. The capping layer 80 may contain an organic material. The capping layer 80 may protect the second electrode CE from a subsequent process, for example, a sputtering process and may improve the light emission efficiency of the light emitting element 114. The capping layer 80 may have a higher refractive index than a first inorganic layer 91 that will be described below. The capping layer 80 may be omitted in some implementations of this embodiment.

The encapsulation layer 140 may be disposed on the display element layer 130. The encapsulation layer 140 may include the first inorganic layer 91, an organic layer 92, and a second inorganic layer 93. The first inorganic layer 91 and the second inorganic layer 93 protect the display element layer 130 from moisture/oxygen, and the organic layer 92 protects the display element layer 130 from foreign matter such as dust particles. The first inorganic layer 91 and the second inorganic layer 93 may be any one of a silicon nitride layer, a silicon oxynitride layer, and a silicon oxide layer. In an embodiment, the first inorganic layer 91 and the second inorganic layer 93 may include a titanium oxide layer, an aluminum oxide layer, or the like. The organic layer 92 may include, but is not limited to, an acrylate-based organic layer.

The input sensing layer ISPa may include a base insulating layer 151, a first sensing conductive layer 152, a first sensing insulation layer 153, a second sensing conductive layer 154, and a second sensing insulation layer 155. The input sensing layer ISPa may be formed by a continuous process after the display panel DPa is formed. However, the present disclosure is not limited thereto.

The base insulating layer 151 may be directly disposed on the display panel DPa. For example, the base insulating layer 151 may be brought into direct contact with the second inorganic layer 93. The base insulating layer 151 may have a single layer structure or a multi-layer structure. Alternatively, the base insulating layer 151 may be omitted in some implementations of this embodiment. In another case, the base insulating layer 151 may be formed on a separate base layer, and the base layer may be coupled with the display panel DPa through an adhesive member.

Each of the first sensing conductive layer 152 and the second sensing conductive layer 154 may have a single layer structure, or may have a multi-layer structure stacked along the third direction DR3. The conductive layer having the single layer structure may include a metal layer or a transparent conductive layer. The metal layer may contain molybdenum, silver, titanium, copper, aluminum, and an alloy thereof. The transparent conductive layer may contain transparent conductive oxide such as indium tin oxide (ITO), indium zinc oxide (IZO), zinc oxide (ZnO), indium zinc tin oxide (IZTO), or the like. In addition, the transparent conductive layer may contain a conductive polymer such as PEDOT, a metal nano wire, graphene, or the like.

The conductive layer having the multi-layer structure may include a plurality of metal layers. The metal layers may have, for example, a three-layer structure of titanium/aluminum/titanium. The conductive layer having a multi-layer structure may include at least one metal layer and at least one transparent conductive layer.

Each of the first sensing conductive layer 152 and the second sensing conductive layer 154 may include patterns constituting sensing electrodes. The input sensing layer ISPa may obtain information about an external input through a change in mutual capacitance between the sensing electrodes.

The first sensing insulation layer 153 may be disposed between the first sensing conductive layer 152 and the second sensing conductive layer 154 and may cover the first sensing conductive layer 152. Part of the second sensing conductive layer 154 may be electrically connected with part of the first sensing conductive layer 152 through a contact hole formed through the first sensing insulation layer 153. The second sensing insulation layer 155 may be disposed on the first sensing insulation layer 153 and may cover the second sensing conductive layer 154.

At least one of the first sensing insulation layer 153 or the second sensing insulation layer 155 may include an inorganic film. The inorganic film may contain at least one of aluminum oxide, titanium oxide, silicon oxide, silicon oxynitride, zirconium oxide, or hafnium oxide.

At least one of the first sensing insulation layer 153 or the second sensing insulation layer 155 may include an organic film. The organic film may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 25:
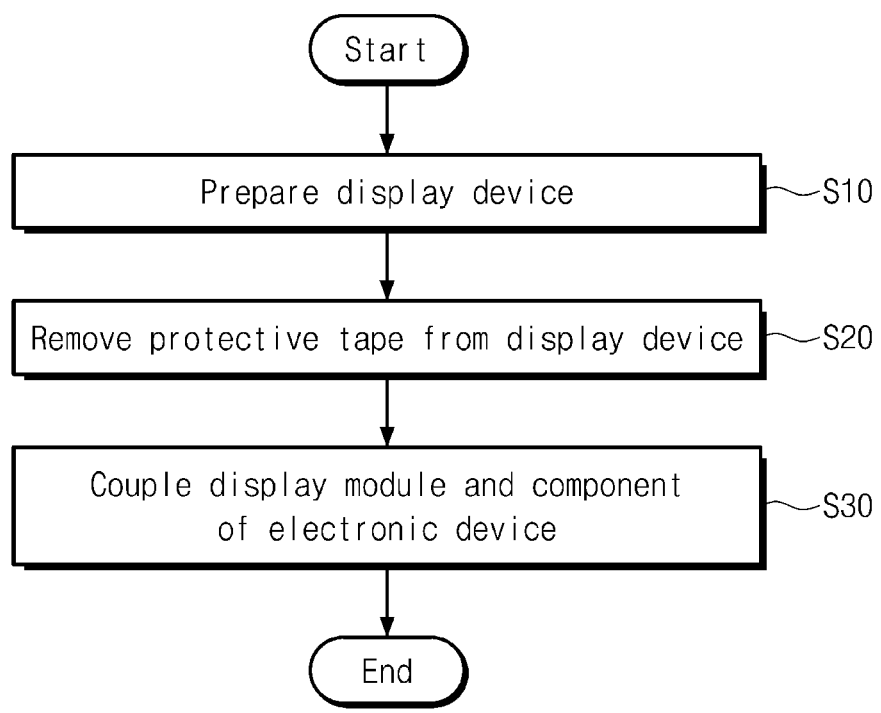
FIG. 25 is a flowchart illustrating a method for fabricating an electronic device according to an embodiment.

FIG. 25 is a flowchart illustrating a method for fabricating an electronic device according to an embodiment. Reference numerals refer to FIGS. 1A to 24.

First, a display device DD or DDa is prepared (S10). The display device DD or DDa may be the display device DD or DDa described above with reference to FIGS. 1A to 24. The display device DD or DDa includes a window WM, a display module DM or DMa, and a protection tape PTa, PTb, PTc, PTd, PTe, PTf, PTg, PTh, or PTi. Accordingly, the preparing of the display device DD or DDa may include attaching the protection tape PTa, PTb, PTc, PTd, PTe, PTf, PTg, PTh, or PTi to the rear surface of the display module DM or DMa.

While the display device DD or DDa is transported, the display module DM or DMa may be protected by the protection tape PTa, PTb, PTc, PTd, PTe, PTf, PTg, PTh, or PTi and thus may be provided without a defect.

Next, the protection tape PTa, PTb, PTc, PTd, PTe, PTf, PTg, PTh, or PTi is removed from the display device DD or DDa (S20).

Then, the display module DM or DMa is coupled with a component of the electronic device ED (S30). The component of the electronic device ED may include an external case EDC (illustrated in FIG. 1B) physically coupled with the display module DM or DMa.

An adhesive member and additional structures may be used when the component of the electronic device ED and the display module DM or DMa are physically coupled.

According to the embodiments described herein, the display device may include the protection tape for protection of the display module, and thus the display module may be stably protected in the fabrication of the electronic device.

In addition, the protection tape may be fabricated to have a standardized shape and may be commonly used for different types of display devices accordingly. Thus, the time spent fabricating the protection tape and the manufacturing cost may be reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a window;
a display module disposed under the window; and
a protection tape disposed on a rear surface of the display module and configured to protect the display module,
wherein the display module includes a display panel and a flexible circuit film that is bent and disposed on a rear surface of the display panel,
wherein the protection tape includes:
an insulating base layer that does not have any integral protrusions and including a first area and a second area;
an adhesive layer disposed between the insulating base layer and the rear surface of the display module in the second area; and
a step portion comprising a step layer disposed on the insulating base layer in the first area,
wherein the step layer directly contacts a lower surface of the flexible circuit film,
wherein the step portion forms a gap between the insulating base layer and the flexible circuit film,
wherein an end of the protection tape is located further outward than an end of the window with respect to a center area of the display module, and
wherein the step layer and the insulating base layer are not integrally formed with each other.

2. The display device of claim 1,
wherein the first area of the insulating base layer overlaps the flexible circuit film, and
wherein the second area of the insulating base layer does not overlap the flexible circuit film.

3. The display device of claim 2, wherein the adhesive layer is disposed on the insulating base layer in the second area and does not overlap the flexible circuit film.

4. The display device of claim 3, wherein the step layer does not overlap the adhesive layer.

5. The display device of claim 4, wherein the protection tape further includes a sub-adhesive layer disposed between the step layer and the insulating base layer and configured to couple the step layer to the insulating base layer.

6. The display device of claim 2, wherein the adhesive layer is disposed on the insulating base layer in the first area and the second area and overlaps the flexible circuit film.

7. The display device of claim 6, wherein the protection tape further includes a cover layer disposed on the adhesive layer in the first area.

8. The display device of claim 7, wherein the step layer is disposed on the cover layer.

9. The display device of claim 8, wherein the protection tape further includes a sub-adhesive layer disposed between the step layer and the cover layer and configured to fix the step layer to the cover layer.

10. The display device of claim 9, wherein the sum of a thickness of the step layer and a thickness of the sub-adhesive layer ranges from about 1 mm to about 1.5 mm.

11. The display device of claim 2, wherein a first gap between the end of the protection tape and the end of the window ranges from about 1 mm to about 2 mm.

12. The display device of claim 11, wherein a second gap between the end of the protection tape and a bent portion of the flexible circuit film is greater than the first gap.

13. The display device of claim 1, wherein the display panel includes a first non-bending area, a bending area, and a second non-bending area arranged in a second direction crossing a bending axis extending in a first direction, and
wherein the flexible circuit film is coupled to the second non-bending area.

14. The display device of claim 13, wherein the first area of the insulating base layer overlaps the bending area, the second non-bending area, and the flexible circuit film, and
wherein the second area of the insulating base layer does not overlap the bending area, the second non-bending area, and the flexible circuit film.

15. The display device of claim 13, wherein a first gap between the end of the protection tape and the end of the window ranges from about 1 mm to about 2 mm.

16. The display device of claim 15, wherein a third gap between the end of the protection tape and the bending area of the display panel is greater than the first gap.

17. The display device of claim 15, wherein the display panel includes:
a plurality of pixels disposed on the first non-bending area; and
a plurality of data lines connected to the plurality of pixels, and
wherein the plurality of data lines extend from the first non-bending area and are disposed to the second non-bending area via the bending area.

18. The display device of claim 17, wherein the protection tape further includes at least one data opening formed through the insulating base layer and configured to overlap some of the data lines disposed on the second non-bending area.

19. The display device of claim 18, wherein the protection tape further includes a groove concavely formed on an end surface of the insulating base layer and configured to overlap some of the data lines disposed on the second non-bending area.

20. The display device of claim 13, wherein the display module further includes a driving chip mounted on the second non-bending area.

21. The display device of claim 1, wherein the display module further includes a plurality of drive elements mounted on the flexible circuit film, and
wherein the insulating base layer includes at least one opening formed through the insulating base layer and configured to expose the drive elements.

22. The display device of claim 1, wherein the insulating base layer includes at least one alignment hole for alignment of the flexible circuit film and the protection tape, the at least one alignment hole being formed through the insulating base layer.

23. The display device of claim 1, wherein the insulating base layer contains at least one of polyethylene terephthalate (PET), polyimide (PI), polyamide (PAI), polyethylene naphthalate (PEN), or polycarbonate (PC).

24. The display device of claim 23, wherein the step layer contains a same material as the insulating base layer.

25. The display device of claim 1, wherein the protection tape has a greater thickness in the first area than in the second area.

26. A method for fabricating an electronic device, the method comprising:
preparing the display device of claim 1;
removing the protection tape from the display device; and
coupling the display module with a component of the electronic device.

27. The method of claim 26, wherein the step layer does not overlap the adhesive layer, and
wherein a sub-adhesive layer is disposed between the step layer and the insulating base layer and fixes the step layer to the insulating base layer.

28. The method of claim 26, wherein the insulating base layer contains at least one of polyethylene terephthalate (PET), polyimide (PI), polyamide (PAI), polyethylene naphthalate (PEN), or polycarbonate (PC).

29. The method of claim 28, wherein the step layer contains a same material as the insulating base layer.

30. The display device of claim 1, wherein the step layer defines a majority of a thickness of the step portion.

31. A display device comprising:
a window;
a display module disposed under the window; and
a protection tape disposed on a rear surface of the display module and configured to protect the display module,
wherein the protection tape includes:
an insulating base layer that does not have any integral protrusions and including a first area and a second area;
an adhesive layer disposed on the insulating base layer in the first and second areas;
a cover layer disposed directly on the adhesive layer in the first area;
a step layer disposed on the cover layer; and
a sub-adhesive layer disposed between the step layer and the cover layer, and
wherein an end of the protection tape is located further outward than an end of the window with respect to a center area of the display module.

32. The display device of claim 31, wherein the sum of a thickness of the step layer and a thickness of the sub-adhesive layer ranges from about 1 mm to about 1.5 mm.

33. The display device of claim 31, wherein a first gap between the end of the protection tape and the end of the window ranges from about 1 mm to about 2 mm.

34. The display device of claim 31, wherein the insulating base layer contains at least one of polyethylene terephthalate (PET), polyimide (PI), polyamide (PAI), polyethylene naphthalate (PEN), or polycarbonate (PC).

35. The display device of claim 31, wherein the step layer and the cover layer contain a same material as the insulating base layer.

36. A method for fabricating an electronic device, the method comprising:
preparing the display device of claim 31;
removing the protection tape from the display device; and
coupling the display module with a component of the electronic device.

37. The method of claim 36,
wherein the sub-adhesive layer is disposed between the step layer and the cover layer and fixes the step layer to the cover layer.

* * * * *